United States Patent
Liao

(10) Patent No.: US 11,264,390 B2
(45) Date of Patent: Mar. 1, 2022

(54) SEMICONDUCTOR MEMORY DEVICE WITH AIR GAPS BETWEEN CONDUCTIVE FEATURES AND METHOD FOR PREPARING THE SAME

(71) Applicant: NANYA TECHNOLOGY CORPORATION, New Taipei (TW)

(72) Inventor: Chun-Cheng Liao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/850,427

(22) Filed: Apr. 16, 2020

(65) Prior Publication Data

US 2021/0327882 A1  Oct. 21, 2021

(51) Int. Cl.
| | | |
|---|---|---|
| H01L 27/108 | (2006.01) | |
| H01L 23/532 | (2006.01) | |
| H01L 29/49 | (2006.01) | |
| H01L 21/762 | (2006.01) | |
| H01L 21/768 | (2006.01) | |

(Continued)

(52) U.S. Cl.
CPC .... *H01L 27/10823* (2013.01); *H01L 21/7682* (2013.01); *H01L 21/76224* (2013.01); *H01L 23/528* (2013.01); *H01L 23/5226* (2013.01); *H01L 23/5329* (2013.01); *H01L 27/10814* (2013.01); *H01L 27/10852* (2013.01); *H01L 27/10876* (2013.01); *H01L 27/10885* (2013.01); *H01L 27/10891* (2013.01); *H01L 28/60* (2013.01); *H01L 29/4966* (2013.01); *H01L 21/76229* (2013.01); *H01L 27/10897* (2013.01)

(58) Field of Classification Search
CPC ......... H01L 27/10823; H01L 21/76224; H01L 27/10814; H01L 23/5329; H01L 28/60; H01L 27/10876; H01L 23/528; H01L 27/10885; H01L 29/4966; H01L 27/10891; H01L 27/10852; H01L 21/7682; H01L 23/5226; H01L 21/76229; H01L 27/10897
See application file for complete search history.

(56) References Cited

U.S. PATENT DOCUMENTS

2015/0126013 A1* 5/2015 Hwang ............... H01L 23/5226
                                                            438/381
2018/0158718 A1* 6/2018 Lee .................... H01L 27/10894
(Continued)

*Primary Examiner* — Patricia D Valenzuela
(74) *Attorney, Agent, or Firm* — Muncy, Geissler, Olds & Lowe, P.C.

(57) ABSTRACT

The present disclosure provides a semiconductor memory device with air gaps between conductive features for reducing capacitive coupling and a method for preparing the semiconductor memory device. The semiconductor memory device includes an isolation layer defining a first active region in a substrate; a first doped region positioned in the first active region; a first word line buried in a first trench adjacent to the first doped region; a high-level bit line contact positioned on the first doped region; a first air gap surrounding the high-level bit line contact; wherein the first word line comprises a lower electrode structure and an upper electrode structure on the lower electrode structure; wherein the upper electrode structure comprises: a source layer substantially covering a sidewall of the first trench; a conductive layer on the source layer; and a work-function adjustment layer disposed between the source layer and the conductive layer.

18 Claims, 28 Drawing Sheets

(51) Int. Cl.
    *H01L 23/528*     (2006.01)
    *H01L 23/522*     (2006.01)
    *H01L 49/02*     (2006.01)

(56) References Cited

U.S. PATENT DOCUMENTS

| | | | |
|---|---|---|---|
| 2018/0198000 A1* | 7/2018 | Romanescu | H01L 29/93 |
| 2019/0267386 A1* | 8/2019 | Lee | H01L 29/4236 |
| 2021/0028104 A1* | 1/2021 | Lee | H01L 27/1157 |

* cited by examiner

SEMICONDUCTOR MEMORY DEVICE WITH AIR GAPS BETWEEN CONDUCTIVE FEATURES AND METHOD FOR PREPARING THE SAME

TECHNICAL FIELD

The present disclosure relates to a semiconductor memory device and method for preparing the same, and more particularly, to a semiconductor memory device with air gaps between conductive features for reducing capacitive coupling.

DISCUSSION OF THE BACKGROUND

Semiconductor devices are widely used in electronics industries. Semiconductor devices may have relatively small sizes, multi-functional characteristics, and/or relatively low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices.

Relatively high-speed and relatively low-voltage semiconductor devices may satisfy desired characteristics (e.g., high speed and/or low power consumption) of electronic devices including semiconductor devices. Semiconductor devices may be relatively highly integrated. Reliability of semiconductor devices may be reduced by relatively high integration density of the semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor memory device, comprising: an isolation layer defining a first active region in a substrate; a first doped region positioned in the first active region; a first word line buried in a first trench adjacent to the first doped region; a high-level bit line contact positioned on the first doped region; a first air gap surrounding the high-level bit line contact; wherein the first word line comprises a lower electrode structure and an upper electrode structure on the lower electrode structure; wherein the upper electrode structure comprises: a source layer substantially covering a sidewall of the first trench; a conductive layer on the source layer; and a work-function adjustment layer disposed between the source layer and the conductive layer.

In some embodiments, the semiconductor memory device further comprises: a second word line buried in a second trench in a second active region of the substrate, the second active region being separated from the first active region by the isolation layer; a second doped region positioned adjacent to the second word line; a low-level bit line positioned over the second doped region; and a second air gap positioned adjacent to the low-level bit line.

In some embodiments, the semiconductor memory device further comprises: a high-level bit line positioned on the high-level bit line contact; and a low-level bit line contact positioned between the low-level bit line and the second doped region; wherein a height of the low-level bit line contact is less than a height of the high-level bit line contact.

In some embodiments, a width of the low-level bit line is greater than a width of the low-level bit line contact.

In some embodiments, a width of the high-level bit line is greater than a width of the high-level bit line contact.

In some embodiments, a height of the high-level bit line contact is substantially the same as a combined height of the low-level bit line contact and the low-level bit line.

In some embodiments, a top surface of the high-level bit line contact and a top surface of the low-level bit line are substantially at the same level.

In some embodiments, the high-level bit line is asymmetrically positioned on the high-level bit line contact.

In some embodiments, a work function of the lower electrode structure is higher than a work function of the upper electrode structure.

In some embodiments, the work-function adjustment layer conformally covers an inner sidewall of the source layer.

In some embodiments, the source layer extends between the lower electrode structure and the conductive layer to cover a top surface of the lower electrode structure.

Another aspect of the present disclosure provides a method for preparing a semiconductor memory device, comprising: forming an isolation layer defining a first active region in a substrate; forming a first doped region in the first active region; forming a first word line buried in a first trench adjacent to the first doped region; forming a high-level bit line contact positioned on the first doped region; forming a first air gap surrounding the high-level bit line contact; wherein the forming of the first word line comprises: forming a lower electrode structure and an upper electrode structure on the lower electrode structure; wherein the forming of the upper electrode structure comprises: forming a source layer substantially covering a sidewall of the first trench; forming a conductive layer on the source layer; and forming a work-function adjustment layer disposed between the source layer and the conductive layer.

In some embodiments, the method for preparing a semiconductor memory device further comprises: forming a second doped region in a second active region of the substrate, the second active region being separated from the first active region by the isolation layer; forming a second word line buried in a second trench adjacent to second doped region; forming a low-level bit line over the second doped region; and forming a second air gap adjacent to the low-level bit line.

In some embodiments, the method for preparing a semiconductor memory device further comprises: forming a high-level bit line on the high-level bit line contact; and forming a low-level bit line contact between the low-level bit line and the second doped region; wherein a height of the low-level bit line contact is less than a height of the high-level bit line contact.

In some embodiments, the first air gap and the second air gap are integrally formed, and the low-level bit line contact, the low-level bit line, and the high-level bit line contact are integrally formed.

In some embodiments, a top surface of the high-level bit line contact and a top surface of the low-level bit line are substantially at the same level.

In some embodiments, a work function of the lower electrode structure is higher than a work function of the upper electrode structure.

In some embodiments, the work-function adjustment layer conformally covers an inner sidewall of the source layer.

In some embodiments, the work-function adjustment layer includes a metal or a metal nitride, and wherein the work-function adjustment element includes lanthanum (La).

In conclusion, the work-function adjustment layer having a relatively low work function disposed outside the conductive layer of the upper electrode structure can reduce or minimize a gate-induced drain leakage current (GIDL) generated from the word line to the doped regions. In addition, the work function of the upper electrode structure may be adjusted by adjusting a doping concentration of the work-function adjustment layer. Thus, a desired low work function of the upper electrode structure may be achieved.

Furthermore, the semiconductor memory device includes a plurality of air gaps, and the conductive features are separated from the each other by the air gaps. Therefore, the parasitic capacitance between the conductive contacts may be reduced. As a result, the overall device performance may be improved (i.e., the decreased power consumption and resistive-capacitive (RC) delay), and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
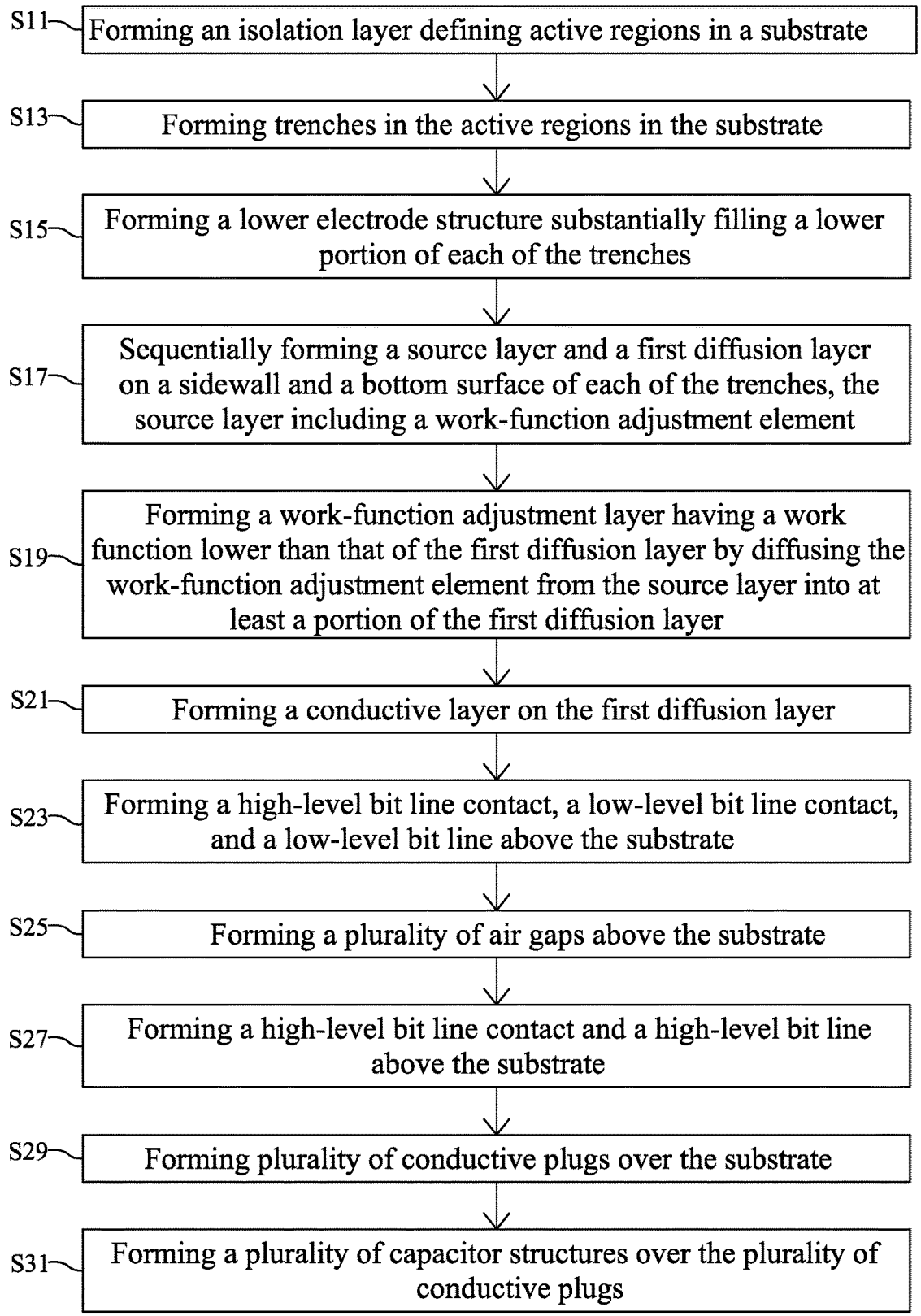
FIG. 1 is a flow diagram illustrating a method for fabricating a semiconductor memory structure with air gaps for reducing capacitive coupling between conductive features according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 is a flow diagram illustrating a method 10 for fabricating a semiconductor memory structure 100 with air gaps for reducing capacitive coupling between conductive features according to some embodiments of the present disclosure. The method 10 may be performed as operations. It may be noted that the method 10 may be performed in any order and may include the same, more, or fewer operations. It may be noted that the method 10 may be performed by one or more pieces of semiconductor fabrication equipment or fabrication tools. In some embodiments, the method 10 includes operations (steps) S11, S13, S15, S17, S19, S21, S23, S25, S27, S29 and S31. The steps S11 to S31 of FIG. 1 are elaborated in connection with following figures.

Figure 2:
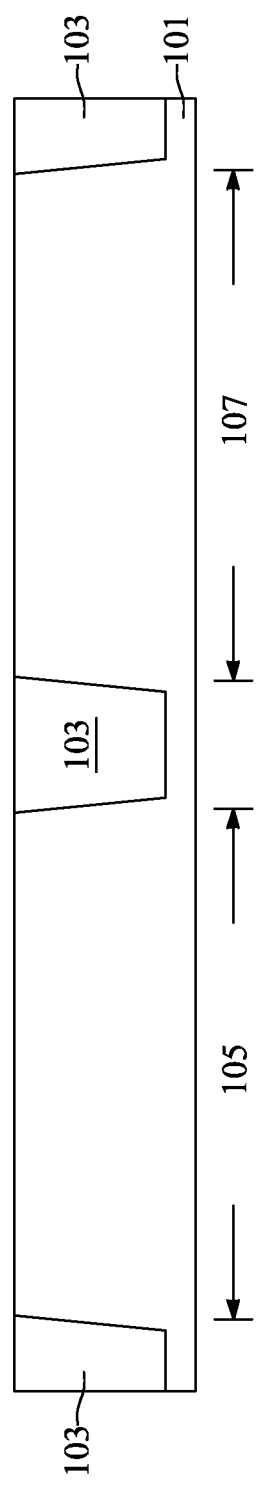
FIG. 2 is a cross-sectional view illustrating an intermediate stage of forming an isolation layer defining active regions in a substrate at the step S11 in the method shown in FIG. 1, in accordance with some embodiments.

FIG. 2 is a cross-sectional view illustrating an intermediate stage of forming an isolation layer defining active regions in a substrate at the step S11 in the method 10 shown in FIG. 1, in accordance with some embodiments. In some embodiments, fabrication processes are performed to form an isolation layer 103 defining a first active region 105 and a second active region 107 in the substrate 101. The first active region 105 and the second active region 107 may be adjacent to each other. For example, the isolation layer 103 may be formed using a shallow-trench isolation (STI) method. The isolation layer 103 may include at least one of a silicon nitride layer, a silicon oxide layer, or a silicon oxynitride layer. The isolation layer 103 may extend into the substrate 101.

In some embodiments, the substrate 11 may be a semiconductor wafer such as a silicon wafer. Alternatively or additionally, the substrate 11 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the substrate 11 includes an epitaxial layer. For example, the substrate 11 has an epitaxial layer overlying a bulk semiconductor. In some embodiments, the substrate 11 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

In some embodiments, the substrate 11 may be a variety of materials, including, but not limited to, sapphire, silicon, gallium nitride (GaN), germanium, or silicon carbide. The substrate 11 may be silicon on insulator (SOI). In some embodiments of the present disclosure, the substrate 11 is silicon. crystallographic orientation of a substantially monocrystalline substrate 11 may be any of (100), (111), or (110) on the Miller Indices. Other crystallographic orientations are also possible. The crystallographic orientations of substrate 11 may be offcut. In some embodiments of the present disclosure, the substrate 11 is (100) silicon with crystalline substrate surface region having cubic crystallinity. In another embodiment, for a (100) silicon substrate 11, the semiconductor surface may be miscut, or offcut, for example 2-10. degree. toward (110). In another embodiment, substrate 11 is (111) silicon with crystalline substrate surface region having hexagonal crystallinity.

Figure 3:
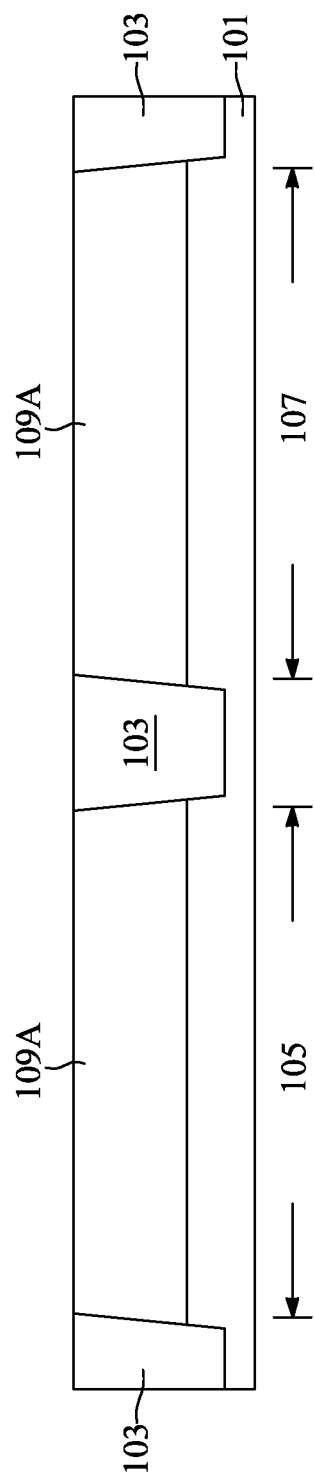
FIGS. 3-4 are cross-sectional views illustrating an intermediate stage of forming a plurality of trenches in the active region is the substrate at the step S13 in the method shown in FIG. 1, in accordance with some embodiments.
Figure 4:
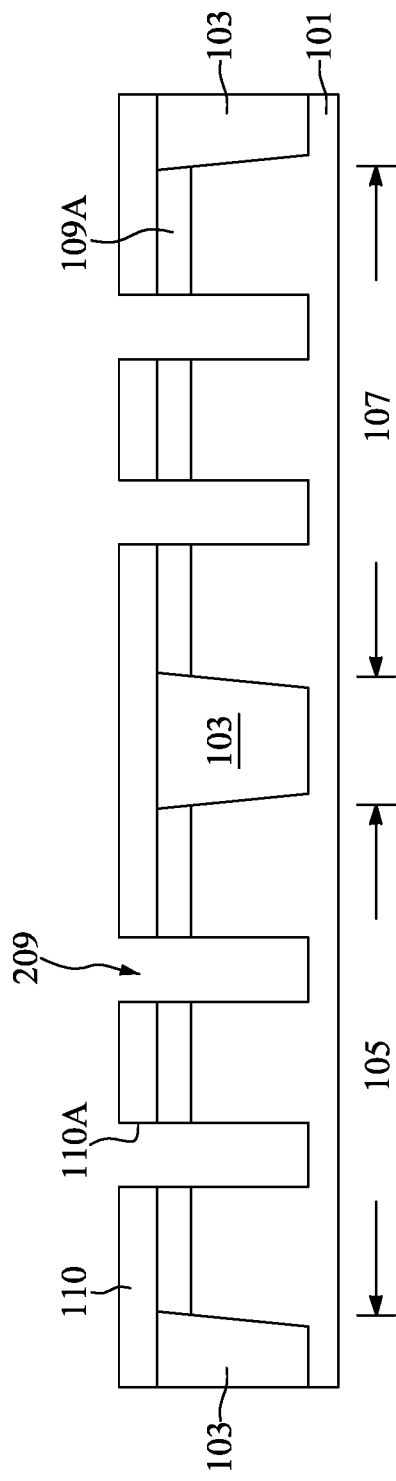

FIGS. 3-4 are cross-sectional views illustrating an intermediate stage of forming a plurality of trenches in the active region is the substrate at the step S13 in the method 10 shown in FIG. 1, in accordance with some embodiments. Referring to FIG. 3, a plurality of first doped regions 109A may be formed in an upper portion of the first active region 105 of the substrate 101 and an upper portion of the second active region 107 of the substrate 101. The plurality of first doped regions 109A may be doped with a dopant such as phosphorus, arsenic, or antimony. The first doped regions 109A may be formed using an ion implantation process.

Referring to FIG. 4, a plurality of word line trenches 209 may be inwardly formed in the upper portion of the first active region 105 and the upper portion of the second active region 107, respectively. The bottoms of the plurality of word line trenches 209 may be at a vertical level lower than a vertical level of bottoms of the plurality of first doped regions 109A.

In some embodiments, a mask layer 110 may be formed on the substrate 101. The mask layer 110 may be formed to have openings 110A that define word line trenches 209 in which word lines (described in more detail below) may be formed. The mask layer 110 may be hard mask patterns formed of, e.g., silicon nitride or photoresist patterns. The substrate 101 and the isolation layer 103 may be etched using the mask layer 110 as an etch mask to form the word line trenches 209 having linear shapes extending in the second direction Y. Bottom surfaces of the trenches 209 may expose the active regions 105. The mask layer 110 may be removed after the etching process is performed. For example, when the mask layer 110 are the photoresist patterns, the mask layer 110 may be removed by an aching process. When the mask layer 110 has the hard mask patterns formed of, e.g., silicon nitride, the mask layer 110 may be removed by a cleaning process using phosphoric acid.

Figure 5:
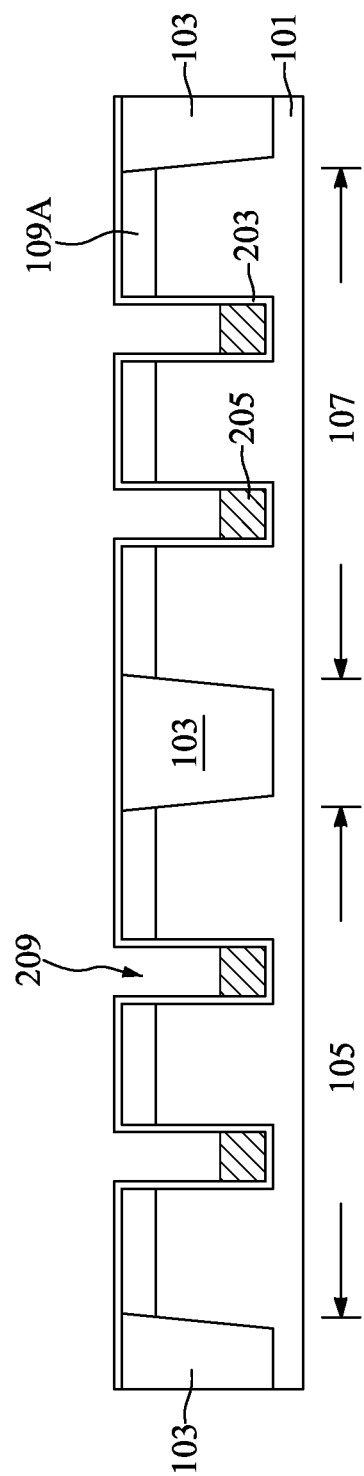
FIG. 5 is a cross-sectional view illustrating an intermediate stage of forming a lower electrode structure substantially filling a lower portion of the trenches at the step S15 in the method shown in FIG. 1, in accordance with some embodiments.

FIG. 5 is a cross-sectional view illustrating an intermediate stage of forming a lower electrode structure substantially filling a lower portion of the trenches at the step S15 in the method 10 shown in FIG. 1, in accordance with some embodiments. With reference to FIG. 5, a plurality of word line insulating layers 203 may be respectively correspondingly formed in the plurality of word line trenches 209, and a plurality of lower electrode structures 205 may be formed in a lower portion of each of the word line trenches 209 in which the insulating layer 203 is formed.

In some embodiments, the insulating layer 203 may be formed using a thermal oxidation process, an atomic layer deposition (ALD) process, and/or a chemical vapor deposition (CVD) process. For example, the insulating layer 203 may include a silicon oxide layer. In some embodiments, a conductive material may be deposited on substantially an entire top surface of the substrate 101 having the insulating layer 203. At this time, the conductive material may substantially fill the trenches 209. The deposition of the conductive material may be performed using a chemical vapor deposition (CVD) process. The conductive material may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). Subsequently, the deposited conductive material may be etched to form the lower electrode structures 205. The etching process may be continuously performed until the conductive material remains with a desired thickness in the trenches 209.

Figure 6:
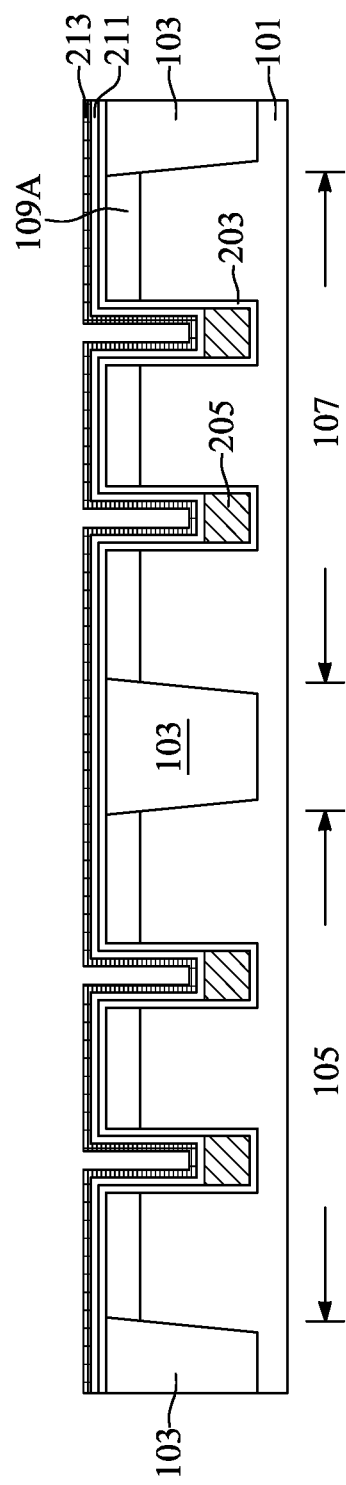
FIG. 6 is a cross-sectional view illustrating an intermediate stage of forming a source layer and a first diffusion layer on a sidewall and a bottom surface of the trenches at the step S17 in the method shown in FIG. 1, in accordance with some embodiments.

FIG. 6 is a cross-sectional view illustrating an intermediate stage of forming a source layer and a first diffusion layer on a sidewall and a bottom surface of the trenches at the step S17 in the method 10 shown in FIG. 1, in accordance with some embodiments. In some embodiments, fabrication processes are performed to form a preliminary source layer 211 and a first diffusion layer 213 on a sidewall and a bottom surface of each of the trenches 209, wherein the source layer may include a work-function adjustment element. In some embodiments, the preliminary source layer 211 may be formed to conformally cover top surfaces of the lower electrode structures 205 and the insulating layer 203. The preliminary source layer 211 may be formed using a chemical vapor deposition (CVD) process. The preliminary source layer 211 may include a work-function adjustment element or a compound of the work-function adjustment element. For example, the work-function adjustment element may include a metal such as lanthanum, strontium, antimony, yttrium, aluminum, tantalum, hafnium, iridium, zirconium, or magnesium.

In some embodiments, a first preliminary diffusion layer 213 may be formed on the substrate 101. The first preliminary diffusion layer 213 may be formed to conformally cover the preliminary source layer 211. The first preliminary diffusion layer 213 may be formed using a chemical vapor deposition (CND) process. The first preliminary diffusion layer 213 may include a metal material or a nitride of the metal material. The metal material may include a metal element different from the work-function adjustment element. For example, the metal material may include a metal element such as titanium or tungsten.

Figure 7:
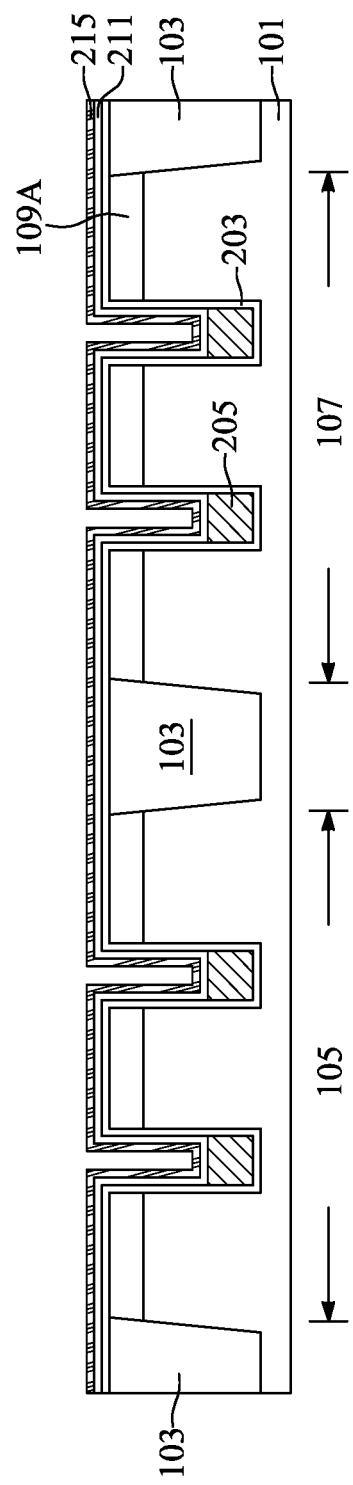
FIG. 7 is a cross-sectional view illustrating an intermediate stage of forming a work-function adjustment layer by diffusing the word-function adjustment element from the source layer into at least a portion of the first diffusion layer at the step S19 in the method shown in FIG. 1, in accordance with some embodiments.

FIG. 7 is a cross-sectional view illustrating an intermediate stage of forming a work-function adjustment layer by diffusing the word-function adjustment element from the source layer into at least a portion of the first diffusion layer at the step S19 in the method 10 shown in FIG. 1, in accordance with some embodiments. In some embodiments, a preliminary work-function adjustment layer 215 may be formed by doping the first preliminary diffusion layer 213 with the work-function adjustment element from the source layer 211. The preliminary work-function adjustment layer 215 may have an effective work function lower than that of the first preliminary diffusion layer 213. For example, the work-function adjustment element of the preliminary source layer 211 may be diffused into the first preliminary diffusion layer 213 to form the preliminary work-function adjustment layer 215. The diffusion of the work-function adjustment element may be performed by a thermal treatment process (e.g., an annealing process). The work-function adjustment element of the preliminary source layer 211 may be diffused into the first preliminary diffusion layer 213 by the thermal treatment process. At this time, substantially the entire first preliminary diffusion layer 213 may be doped with the work-function adjustment element, and thus the first preliminary diffusion layer 213 may be completely formed or converted into the preliminary work-function adjustment layer 215. Thus, the first preliminary diffusion layer 213 need not remain after the diffusion of the work-function adjustment element of the preliminary source layer 211 into the first preliminary diffusion layer 213. Since the work-function adjustment element of the preliminary source layer 211 is diffused into the first preliminary diffusion layer 213, a thickness of the preliminary source layer 211 may be reduced.

In an exemplary embodiment of the present inventive concept, oxygen or nitrogen generated by decomposing the compound of the work-function adjustment element may be diffused toward the lower electrode structure 205. As an example, the work-function adjustment element generated by the decomposition of the thermal treatment process may be diffused into the first preliminary diffusion layer 213 and the remaining oxygen or nitrogen may be diffused toward the lower electrode structure 205. In some embodiments, after the diffusion process (e.g., the thermal treatment process), substantially the entire first preliminary diffusion layer 213 may be doped with the work-function adjustment element and the first preliminary diffusion layer 213 might not remain. However, exemplary embodiments of the present inventive concept are not limited thereto. In an exemplary embodiment of the present inventive concept, a portion of the first preliminary diffusion layer 213 adjacent to the conductive layer 252 need not be doped with the work-function adjustment element, but may remain.

Figure 8:
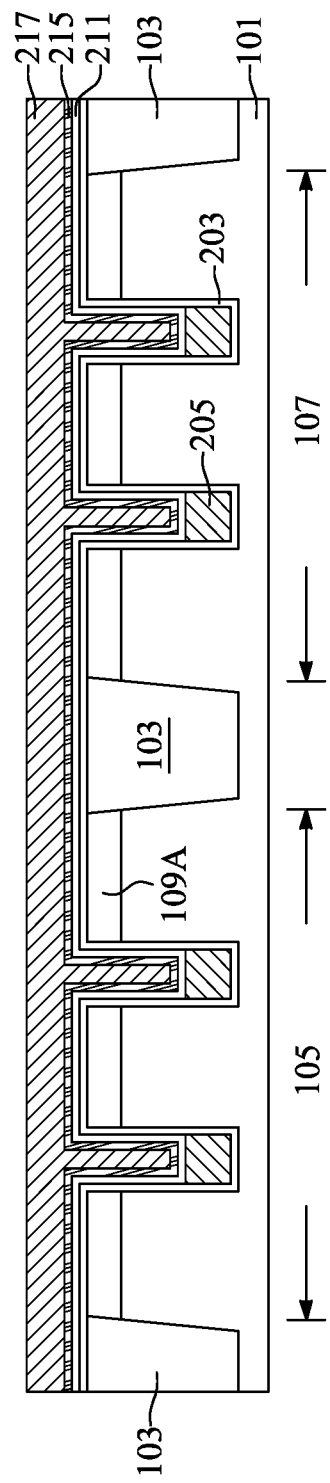
FIG. 8 is a cross-sectional view illustrating an intermediate stage of forming a conductive layer on the first diffusion layer at the step S21 in the method shown in FIG. 1, in accordance with some embodiments.

FIG. 8 is a cross-sectional view illustrating an intermediate stage of forming a conductive layer on the first diffusion layer at the step S21 in the method 10 shown in FIG. 1, in accordance with some embodiments. In some embodiments, a conductive layer 217 may be formed on the substrate 101. The conductive layer 217 may fill remaining portions of the trenches 209 and may cover substantially an entire top surface of the substrate 101 having the first preliminary diffusion layer 213. For example, the conductive layer 217 may cover substantially an entire surface of the first preliminary diffusion layer 213 opposite the preliminary source layer 211. The conductive layer 217 may include a low-resistance material of which a resistance is lower than that of the first preliminary diffusion layer 213. For example, the conductive layer 217 may include a metal such as tungsten, titanium, or tantalum. The conductive layer 217 including a conductive material may be formed on the first preliminary diffusion layer 213 including the metal or the metal nitride.

Figure 9:
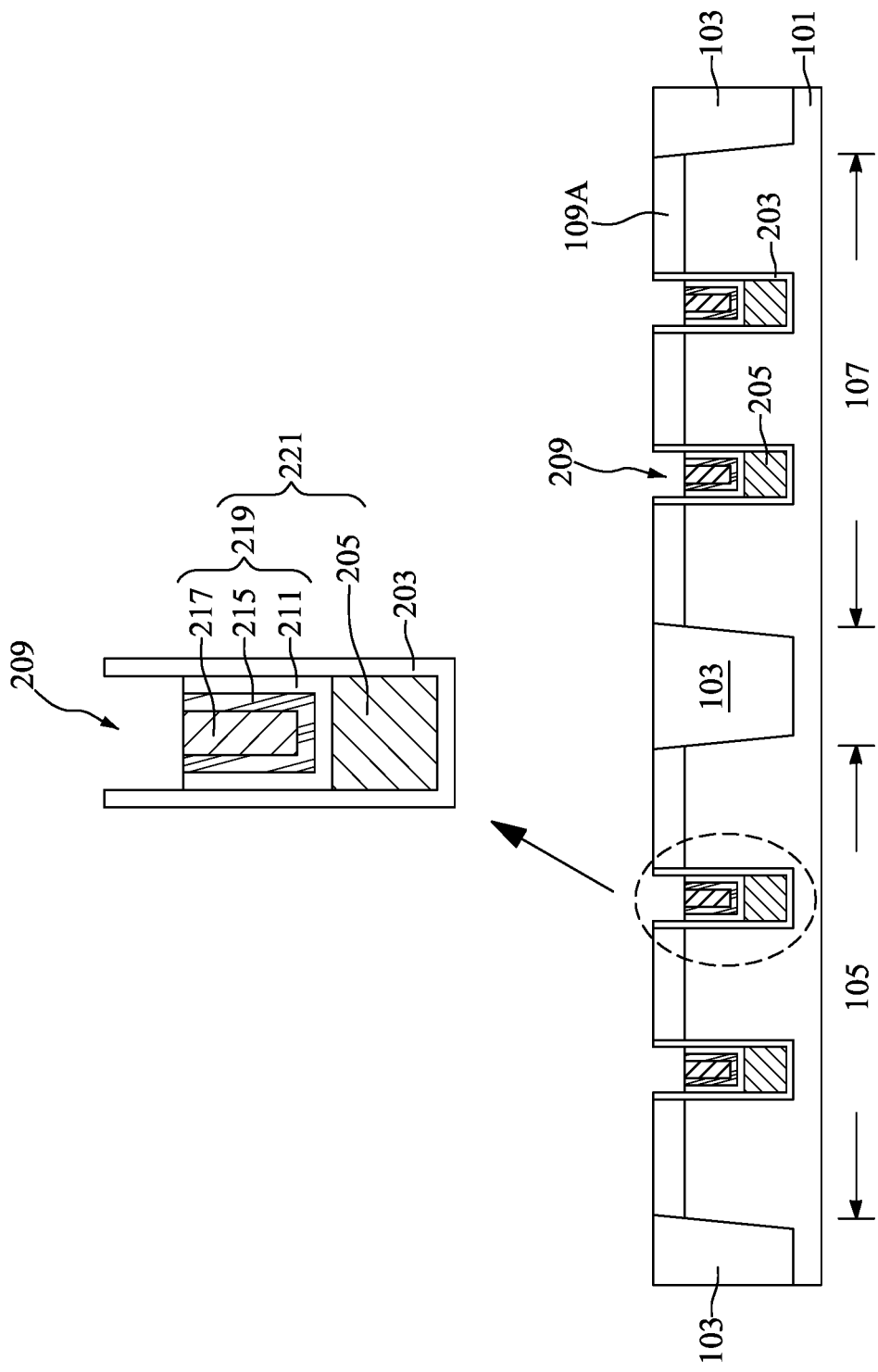
FIG. 9 is a cross-sectional view illustrating an intermediate stage of forming a plurality of word lines in the trenches in the substrate, in accordance with some embodiments.

FIG. 9 is a cross-sectional view illustrating an intermediate stage of forming a plurality of word lines in the trenches in the substrate, in accordance with some embodiments. In some embodiments, the conductive layer 217, the preliminary work-function adjustment layer 215, and the preliminary source layer 211 may be etched to form an upper electrode structure 219 in each of the trenches 209. A plurality of word lines 221 are formed in the active regions 105, 107 in trenches 209 in the substrate 101. The etching process may be continuously performed until the preliminary source layer 211, the preliminary work-function adjustment layer 215 and the conductive layer 217 remain with desired thicknesses in the trenches 209. Top surfaces of the source layer 211, the work-function adjustment layer 215 and the conductive layer 217 formed by the etching process may be disposed at the same level.

Subsequently, the insulating layer 203 which is not covered by the upper electrode structure 219 but is exposed may be removed. Thus, gate insulating patterns 203 may be formed between the active regions 105, 107 and the electrode structures 205 and 217 and/or between the isolation layer 103 and the electrode structures 205 and 217. In addition, top surfaces of the isolation layer 103 and the active regions 105, 107 may be exposed by the etching process.

Figure 10:
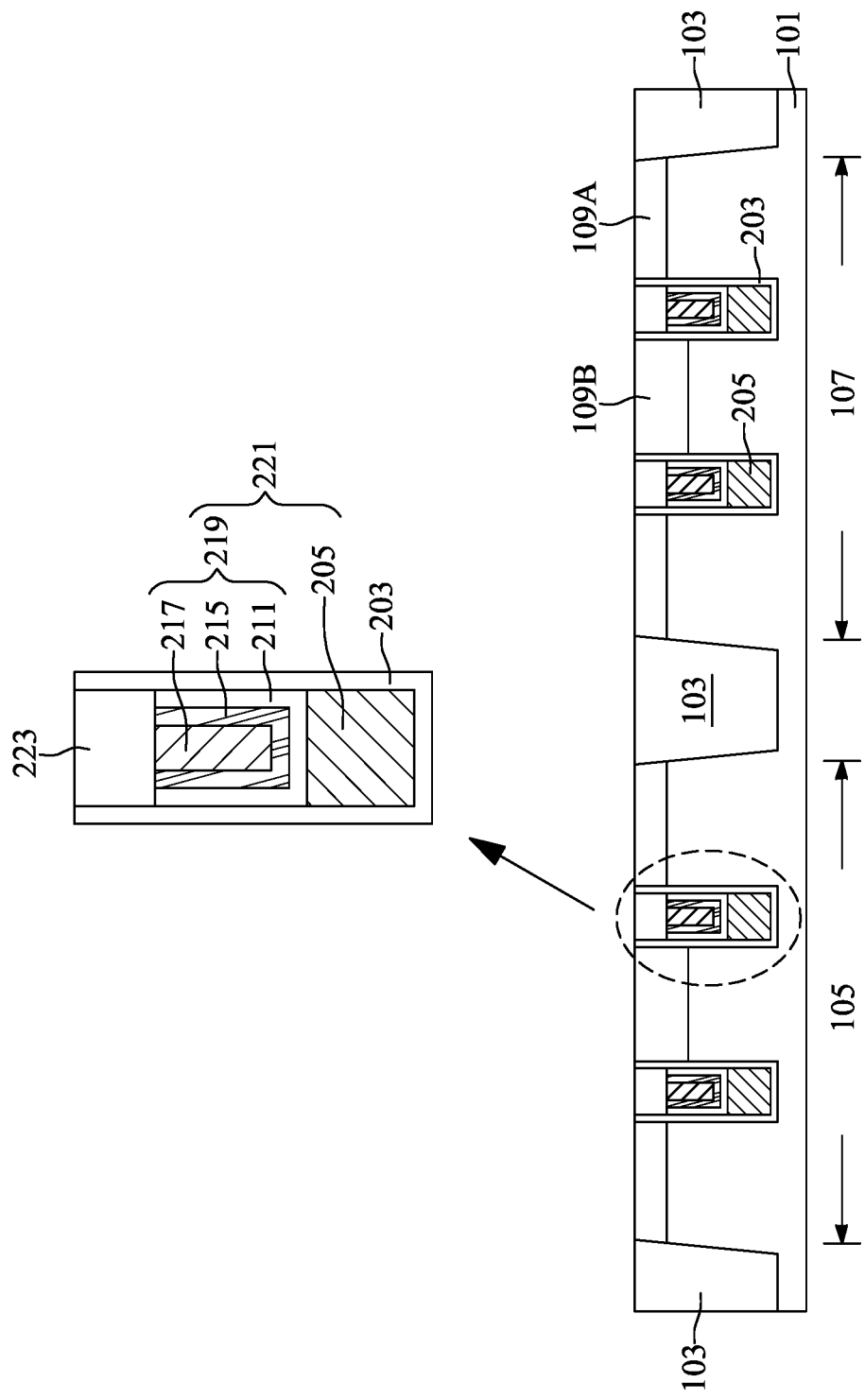
FIG. 10 is a cross-sectional view illustrating an intermediate stage of forming a second doped region in the active regions between two word lines adjacent to each other, in accordance with some embodiments.

FIG. 10 is a cross-sectional view illustrating an intermediate stage of forming a second doped region in the active regions 105, 107 between two word lines adjacent to each other, in accordance with some embodiments. In some embodiments, an ion implantation process may be performed on the substrate 101 to form a second doped region 109B in the active regions 105, 107 between two word lines 221 adjacent to each other. The second doped region 109B may have the same conductivity type as the second dopant injection region 109A. For example, the second doped region 109B may be doped with N-type dopants. in some embodiments, the second doped region 109B may be deeper than the first doped region 109A in the substrate 101.

In some embodiments, first capping patterns 223 may be formed in the trenches 209, respectively. For example, a capping layer may be formed on substantially an entire top surface of the substrate 101, and then, a planarization process may be performed on the capping layer to form the first capping patterns 223. The first capping patterns 223 may include at least one of a silicon nitride layer, a silicon oxide layer, or a silicon oxynitride layer.

In an exemplary embodiment of the present inventive concept, the diffusion process of the work-function adjustment element described with reference to FIGS. 7 to 8 may be performed after formation of the source layer 211, the first diffusion layer 213 and the conductive layer 250. For example, the annealing process may be performed on the source layer 211, the first diffusion layer 213, and the conductive layer 217. The work-function adjustment element of the source layer 211 may be diffused into the first diffusion layer 213 to form the work-function adjustment layer 215. Substantially the entire first diffusion layer 213 may be doped with the work-function adjustment element by the diffusion process, and the first diffusion layer 213 need not remain after the diffusion process. Alternatively, a portion of the first diffusion layer 213 may remain after the diffusion process. In an exemplary embodiment of the present inventive concept, the diffusion process of the work-function adjustment element may be performed immediately after the formation of the source layer 211, the first diffusion layer 213 and the conductive layer 217 or may be performed during a process of manufacturing the semiconductor memory device after the formation of the source layer 211, the first diffusion layer 213 and the conductive layer 217.

Figure 11:
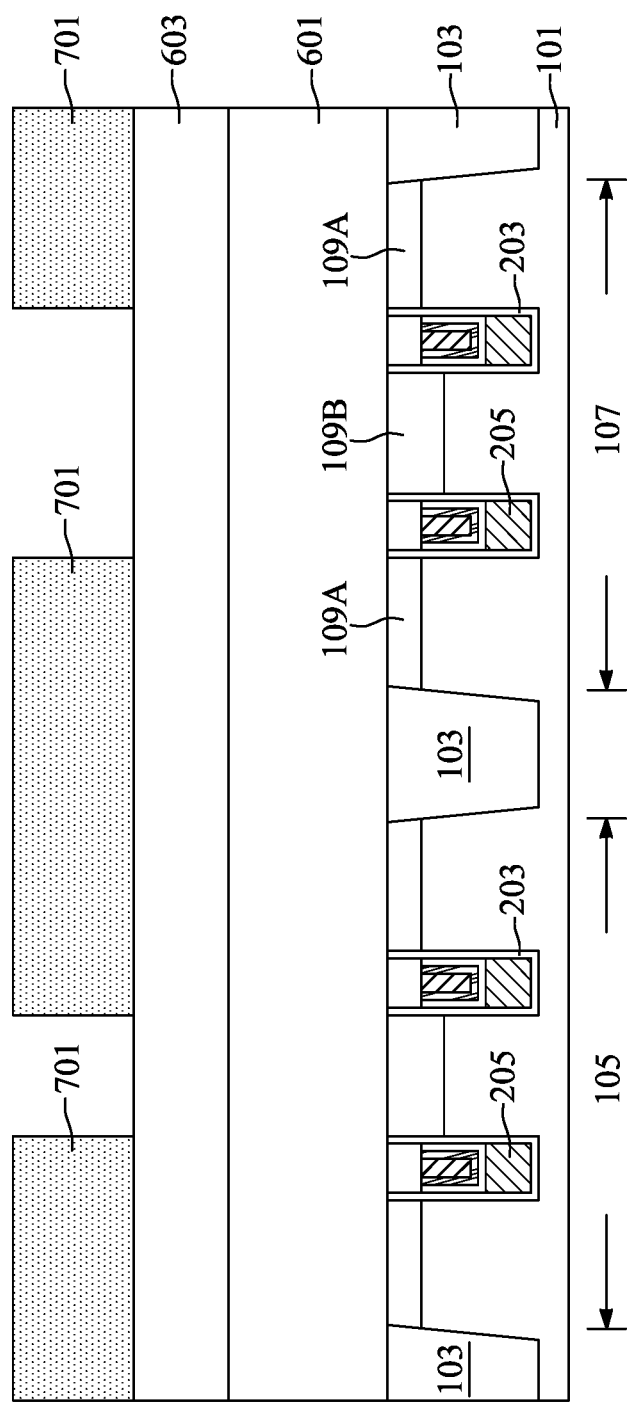
FIGS. 11-20 are cross-sectional views illustrating an intermediate stage of forming a high-level bit line contact, a low-level bit line contact, and a low-level bit line above the substrate at the step S23 in the method shown in FIG. 1, in accordance with some embodiments.

FIGS. 11-20 are cross-sectional views illustrating an intermediate stage of forming a high-level bit line contact, a low-level bit line contact, and a low-level bit line above the substrate at the step S23 in the method 10 shown in FIG. 1, in accordance with some embodiments. With reference to FIG. 11, a first insulating film 601 may be formed on the substrate 101 and a second insulating film 603 may be formed on the first insulating film 601. A first photolithography process may be performed using a first mask pattern 701 to define positions of the high-level bit line contact 303 and the low-level bit line 401 on the second insulating film 603.

Figure 12:
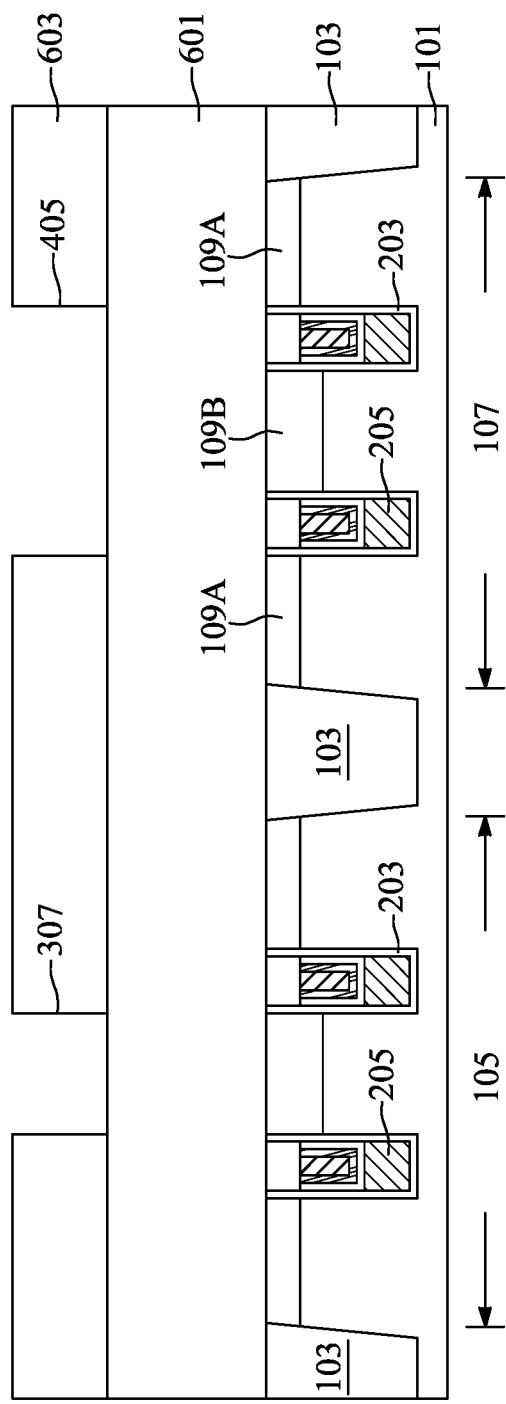

With reference to FIG. 12, a first etch process, such as an anisotropic dry etch process, may be performed after the first photolithography process to form a contact opening 307 of the high-level bit line and a low-level bit line trench 405 in the second insulating film 603.

Figure 13:
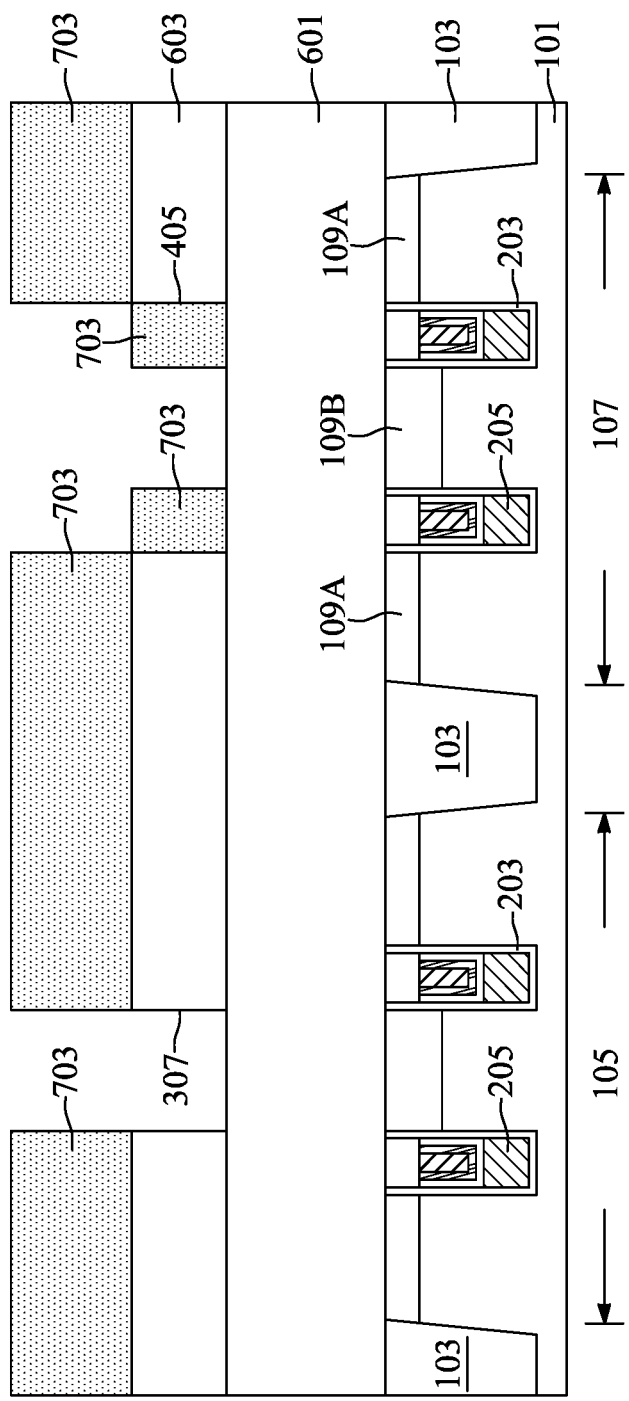

With reference to FIG. 13, a second photolithography process may be performed using a second mask pattern 703 to define the position of the high-level bit line contact 303 and a position of the low-level bit line contact 403 on the first insulating film 601.

Figure 14:
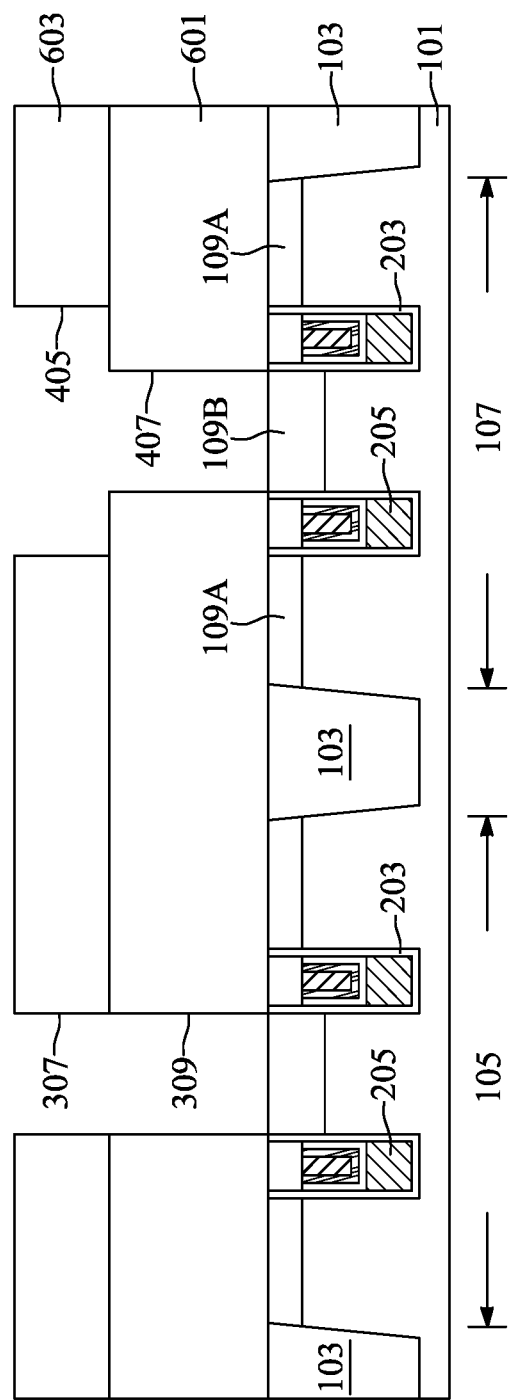

With reference to FIG. 14, a second etch process, such as an anisotropic dry etch process, may be performed after the second photolithography process to form a lower high-level bit line contact opening 309 and a low-level bit line contact opening 407 in the first insulating film 601. The plurality of doped regions 109B disposed between adjacent pairs of the plurality of word lines 201 in the first active region 105 and between adjacent pairs of the plurality of word lines 201 in the second active region 107 may be respectively exposed through the lower high-level bit line contact opening 309 and the low-level bit line contact opening 407.

Figure 15:
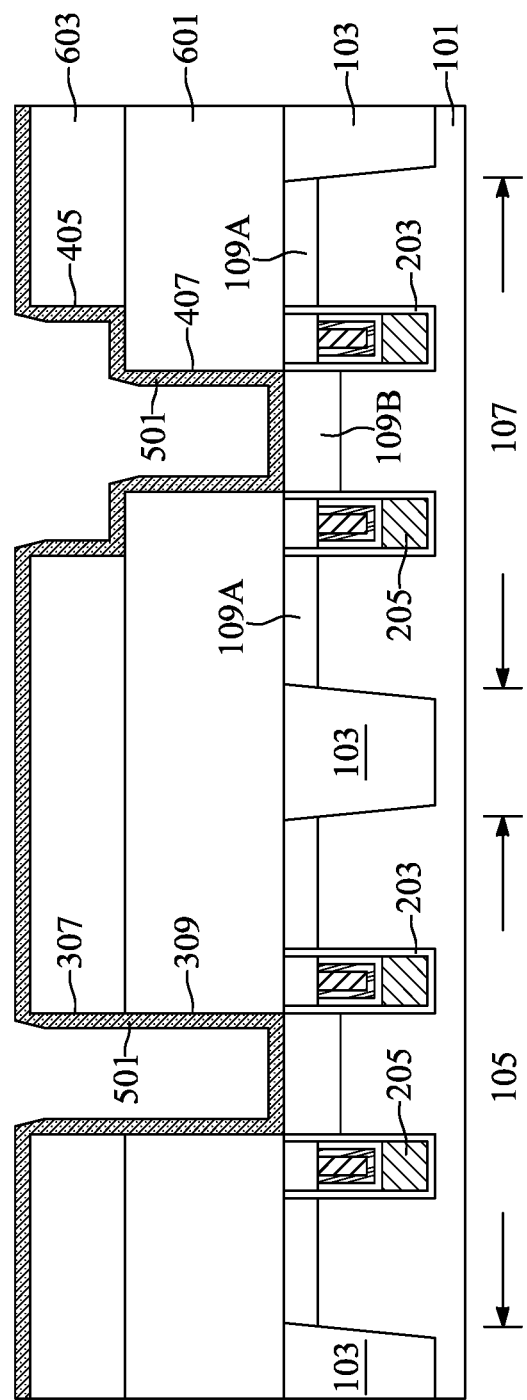

With reference to FIG. 15, a first spacer layer 501 may be formed to cover top surfaces of the second insulating film 603, sidewalls of the upper high-level bit line contact opening 307, sidewalls and bottom of the lower high-level bit line contact opening 309, sidewalls and bottoms of the low-level bit line trench 405, and sidewalls and bottom of the low-level bit line contact opening 407. The first spacer layer 501 may be formed of doped oxide such as borosilica glass, phosphosilica glass, borophosphosilica glass, fluoride silicate glass, carbon doped silicon oxide, or the like. Alternatively, in another embodiment, the first spacer layer 501 may be formed of a thermal decomposable polymer or a thermal degradable polymer.

Figure 16:
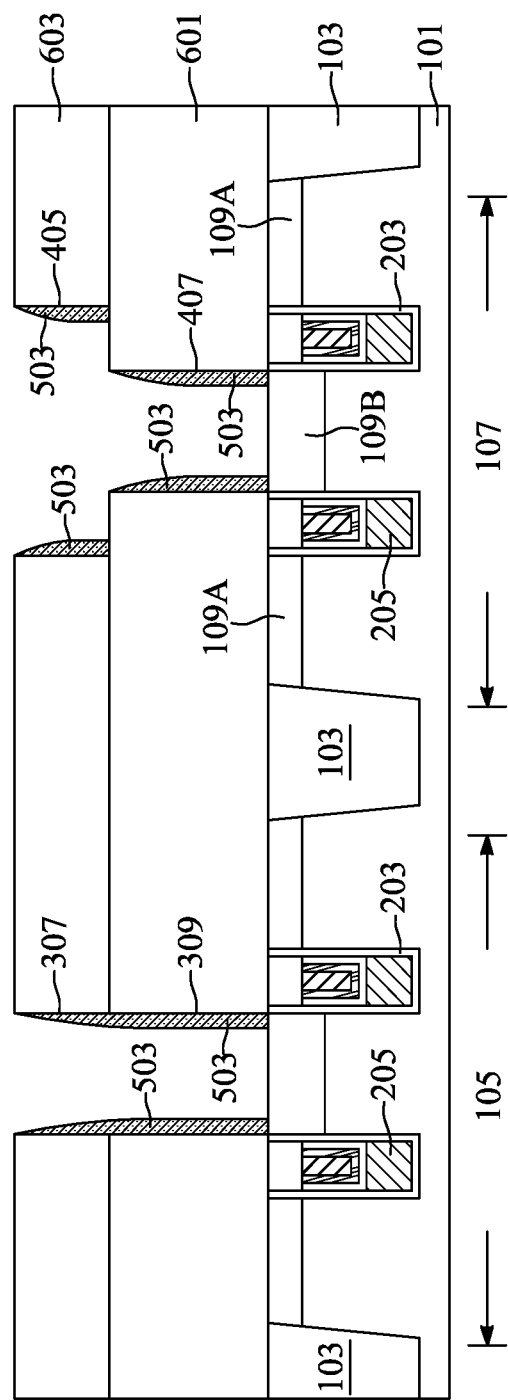

With reference to FIG. 16, an etch process, such as an anisotropic dry etch process, may be performed to form a plurality of first spacers 503 attached to the sidewalls of the upper high-level bit line contact opening 307, the sidewalls of the lower high-level bit line contact opening 309, the sidewalls of the low-level bit line trench 405, and the sidewalls of the low-level bit line contact opening 407.

Figure 17:
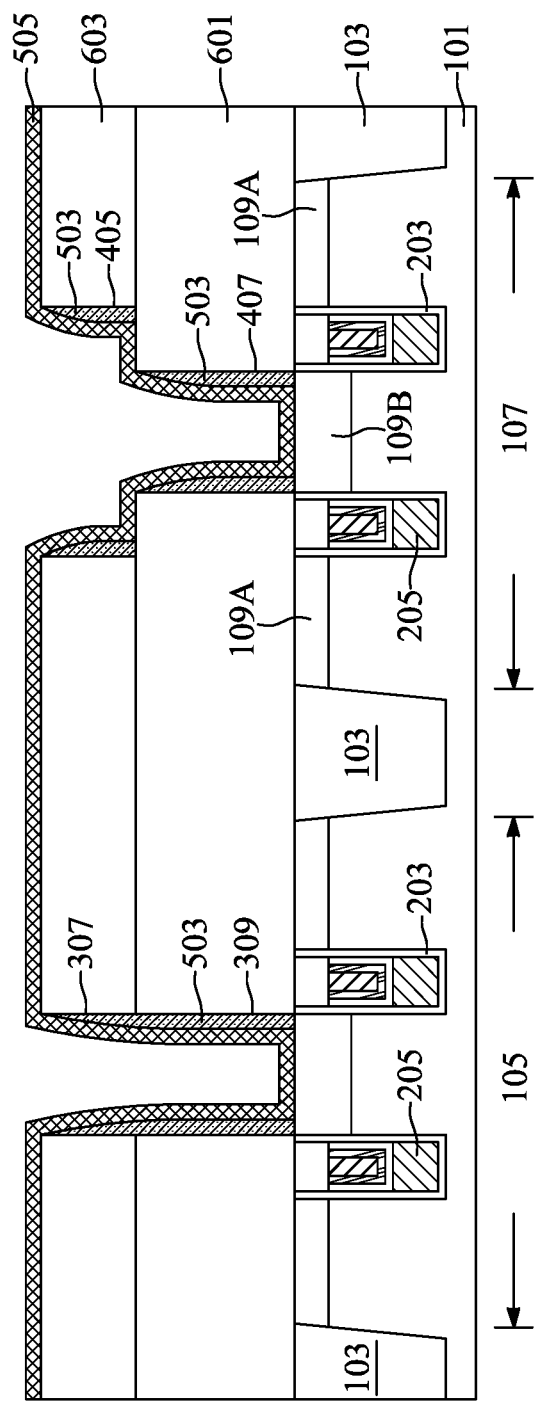

With reference to FIG. 17, a second spacer layer 505 may be formed to cover the top surfaces of the second insulating film 603, the bottoms of the low-level bit line trench 405, the bottom of the low-level bit line contact opening 407, and surfaces of the plurality of first spacers 503. The second spacer layer 505 may be formed of, for example, silicon nitride.

Figure 18:
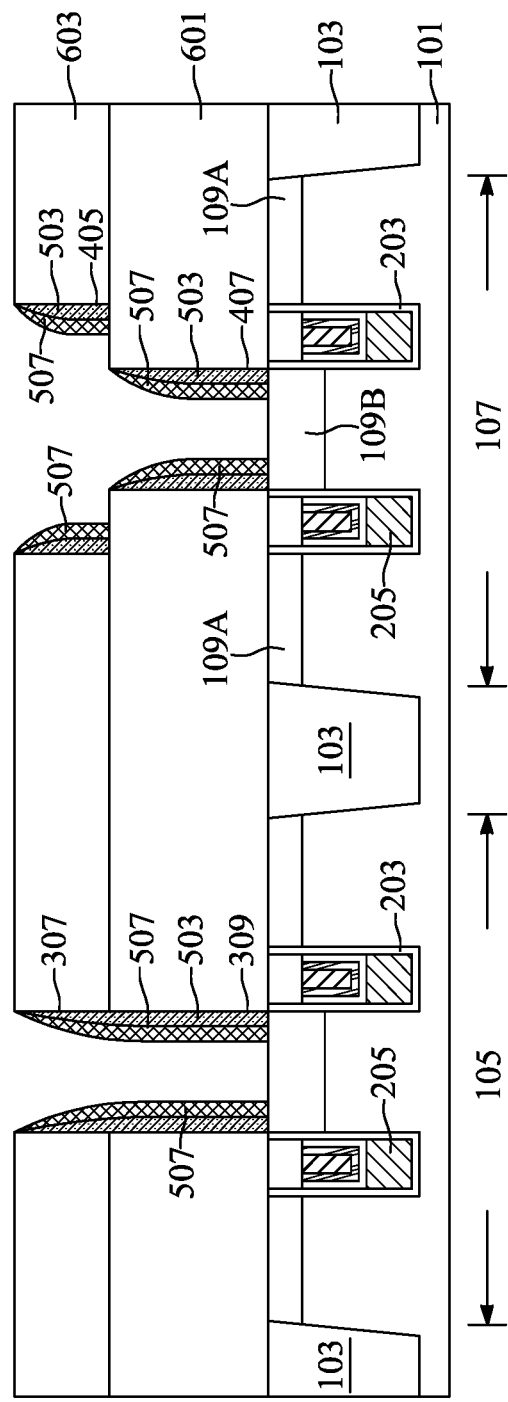

With reference to FIG. 18, an etch process, such as an anisotropic dry etch process, may be performed to form a plurality of second spacers 507 attached to the surfaces of the plurality of first spacers 503.

Figure 19:
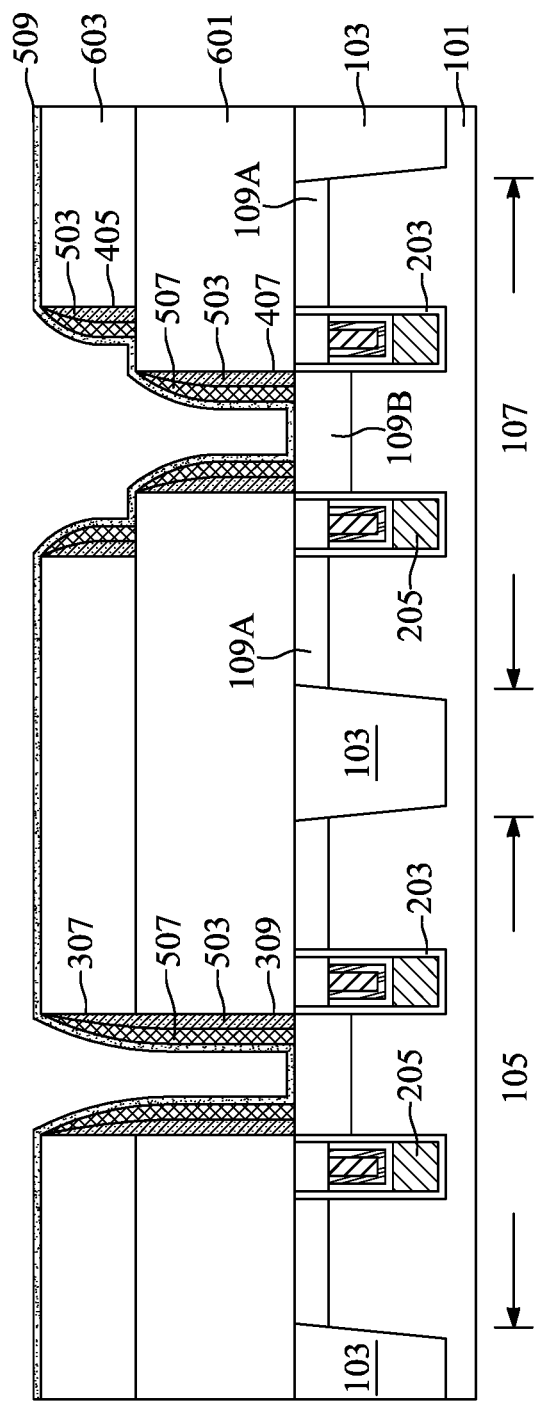

With reference to FIG. 19, a liner layer 509 may be formed to cover the top surfaces of the second insulating film 603, surfaces of the plurality of second spacers 507, the bottoms of the low-level bit line trench 405, and the bottom of the low-level bit line contact opening 407. The liner layer 509 may be formed of, for example, titanium, titanium nitride, titanium silicon nitride, tantalum, tantalum nitride, tantalum silicon nitride, or a combination thereof.

Figure 20:
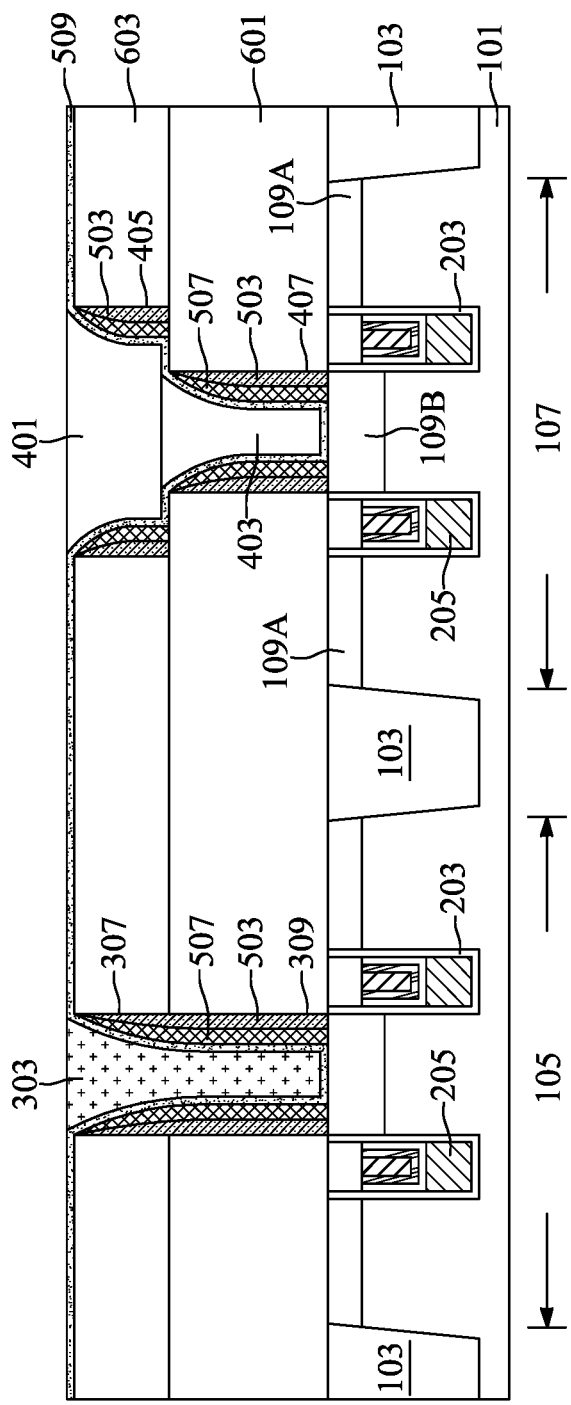

With reference to FIG. 20, a conductive material, for example, doped polysilicon, metal, metal nitride, or metal silicide, may be deposited into the upper high-level bit line contact opening 307, the lower high-level bit line contact opening 309, the low-level bit line trench 405, and the low-level bit line contact opening 407 by a metallization process. In the embodiment depicted, the conductive material may be tungsten. After the metallization process, a planarization process, such as chemical mechanical polishing, may be performed to remove excess filling material, provide a substantially flat surface for subsequent processing steps, and conformally form the high-level bit line contact 303, the low-level bit line contact 403, and the low-level bit line 401. In some embodiments, the low-level bit line contact 403, the low-level bit line 401, and the high-level bit line contact 303 are integrally formed by the same fabrication process, and may have similar physical properties such as hardness and chemical property such as etching rate.

Figure 21:
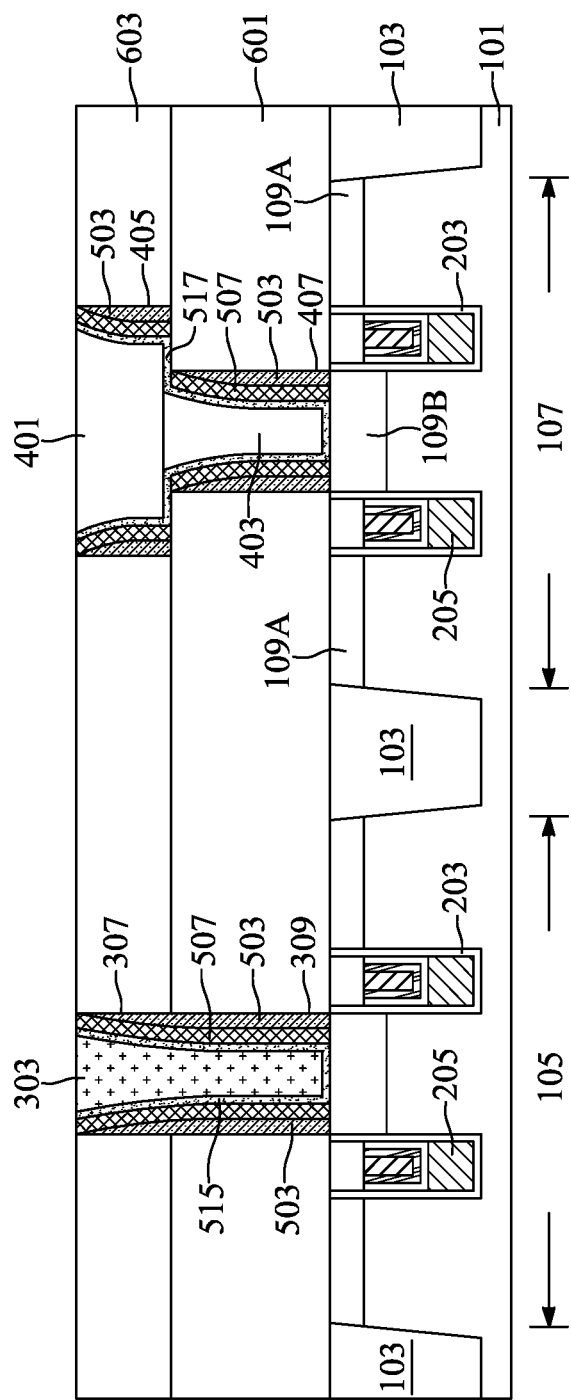
FIGS. 21-22 are cross-sectional views illustrating an intermediate stage of forming a plurality of air gaps above the substrate at the step S25 in the method shown in FIG. 1, in accordance with some embodiments.
Figure 22:
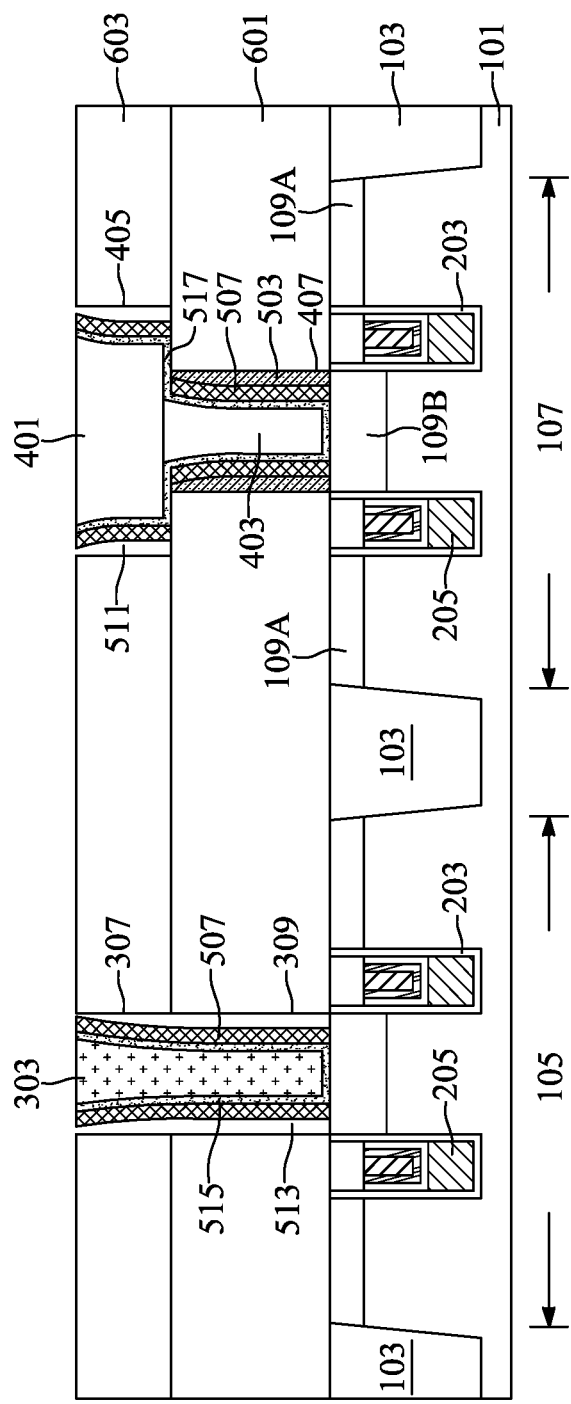

FIGS. 21-22 are cross-sectional views illustrating an intermediate stage of forming a plurality of air gaps above the substrate at the step S25 in the method 10 shown in FIG. 1, in accordance with some embodiments. With reference to FIG. 21, a planarization process, such as chemical mechanical polishing, may be performed to remove part of the liner layer 509. After the planarization process, the liner layer 509 may be turned into a first liner 515 disposed adjacent to sidewalls of the high-level bit line contact 303 and a second liner 517 disposed on and attached to the sidewalls of the low-level bit line 401, sidewalls of the low-level bit line contact 403, a bottom of the low-level bit line contact 403, and a portion of a top surface of the first insulating film 601. Top surfaces of the plurality of first spacers 503 disposed adjacent to the high-level bit line contact 303, and top surfaces of the plurality of first spacers 503 disposed adjacent to the low-level bit line 401 may be exposed after the planarization process.

Referring to FIG. 21, in some embodiments, the height of the low-level bit line contact 403 is less than the height of the high-level bit line contact 30. In some embodiments, the width of the low-level bit line 401 is greater than the width of the low-level bit line contact 403. In some embodiments, the top surface of the high-level bit line contact 303 and the top surface of the low-level bit line 401 are substantially at the same level due to the planarization process, and the height of the high-level bit line contact 303 is substantially the same as a combined height of the low-level bit line contact 403 and the low-level bit line 401.

With reference to FIG. 22, the plurality of first spacers 503 disposed adjacent to the high-level bit line contact 303 and the plurality of first spacers 503 disposed adjacent to the low-level bit line 401 may be removed to form the plurality of air gaps. In some embodiments, a vapor hydrogen fluoride may be introduced and may etch the plurality of first spacers 503 disposed adjacent to the high-level bit line contact 303 and the plurality of first spacers 503 disposed adjacent to the low-level bit line 401. The vapor hydrogen fluoride has a higher etching rate on the plurality of first spacers 503 formed of doped oxide; therefore, the plurality of first spacers 503 disposed adjacent to the high-level bit line contact 303 and the plurality of first spacers 503 disposed adjacent to the low-level bit line 401 may be removed and the plurality of second spacers 507 formed of silicon nitride may be retained. The plurality of second spacers 507 may prevent the material of the high-level bit line contact 303, the low-level bit line 401, or the low-level bit line contact 403 from flowing into the plurality of air gaps during subsequent processing steps such as heat treatment. The plurality of air gaps may include first air gaps 511 and second air gaps 513. The first air gaps 511 may be disposed adjacent to the low-level bit line 401. The second air gaps 513 may be disposed adjacent to the high-level bit line contact 303.

In some embodiments, the air gap 513 and the air gap 511 are integrally formed by selectively etching the first spacers 503 of doped oxide. In some embodiments, the air gap 513 surrounds the high-level bit line contact 303 (cylinder or plug), with the first liner 515 and the second spacers 507 separating the high-level bit line contact 303 from the air gap 513; and, the air gap 511 is formed at two sides of the low-level bit line 401, with the second liner 517 and the second spacers 507 separating the low-level bit line 401 from the air gap 511. In some embodiments, the first spacers 503 at the sides of the low-level bit line contact 403 are not removed, and the air gap 511 is selectively formed at the sides of the low-level bit line 401, not at the sides of the low-level bit line contact 403.

With reference to FIG. 22, alternatively, in another embodiment, the plurality of first spacers 503 are formed of thermal decomposable polymer or thermal degradable polymer, and a heat treating process is applied to remove the thermal decomposable polymer or thermal degradable polymer. A temperature of the heat process may be between about 300° C. and about 450° C. Preferably, the temperature of the heat process may be between about 350° C. and about 420° C.

Figure 23:
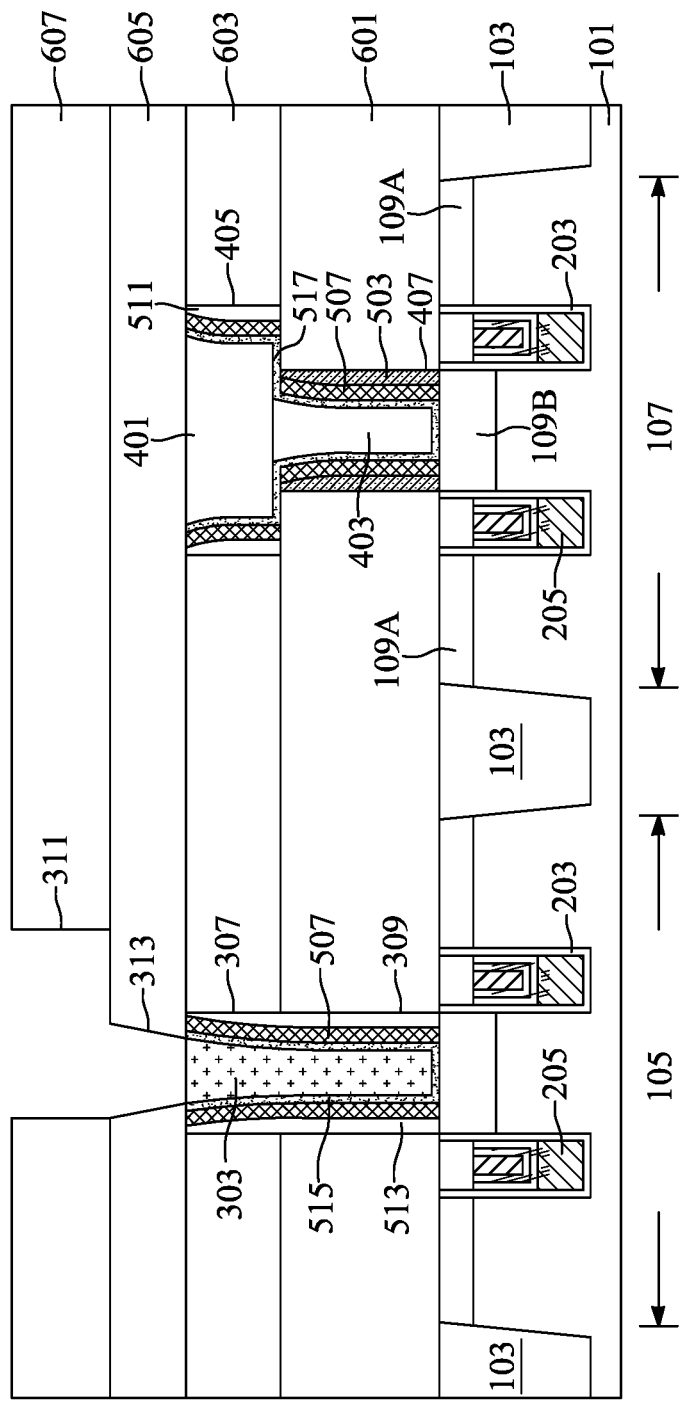
FIGS. 23-24 are cross-sectional views illustrating an intermediate stage of forming a high-level bit line contact and a high-level bit line above the substrate at the step S27 in the method shown in FIG. 1, in accordance with some embodiments.
Figure 24:
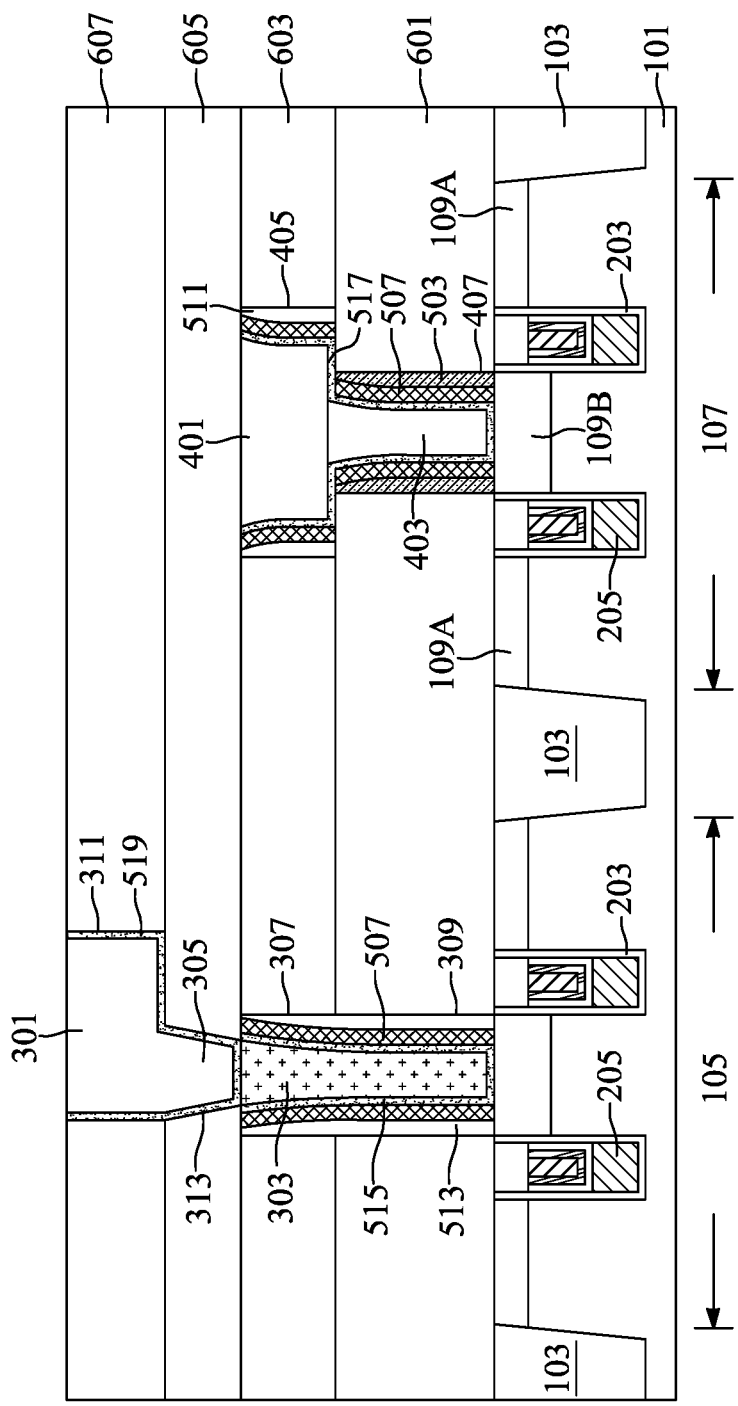

FIGS. 23-24 are cross-sectional views illustrating an intermediate stage of forming a high-level bit line contact and a high-level bit line above the substrate at the step S27 in the method 10 shown in FIG. 1, in accordance with some embodiments. In some embodiments, a high-level bit line contact 305 and a high-level bit line 301 may be formed above the substrate 101. With reference to FIG. 23, a third insulating film 605 may be formed on the second insulating film 603 by, for example, spin-on-glass non-gap fill deposition. It should be noted that the first air gaps 511 and the second air gaps 513 may not be filled after the formation of the third insulating film 605. A fourth insulating film 607 may be formed on the third insulating film 605. A first photolithography process may be performed to define a position of the high-level bit line 301 on the fourth insulating film 607. After the first photolithography process, a first etch process, such as an anisotropic dry etch process, may be performed to form a high-level bit line trench 311 in the fourth insulating film 607. A second photolithography process may be performed to define positions of the high-level bit line contact 305 on the third insulating film 605.

With reference to FIG. 23, a second etch process, such as an anisotropic dry etch process, may be performed after the second photolithography process to form a high-level bit line contact opening 313 in the third insulating film 605. A width of a bottom opening of the high-level bit line contact opening 313 may be less than a width of a top opening of the high-level bit line contact opening 313; in other words, a profile of the high-level bit line contact opening 313 may be tapered from top to bottom. That is to say, sidewalls of the high-level bit line contact opening 313 may be slanted toward each other. The width of the bottom opening of the high-level bit line contact opening 313 may be about the same as a width of a top surface of the high-level bit line contact 303. The top surface of the high-level bit line contact 303 may be exposed through the high-level bit line contact opening 313 and the high-level bit line trench 311. A cleaning process using a reducing agent may be optionally performed to remove the defects on the top surface of the high-level bit line contact 303 formed including tungsten. The reducing agent may be titanium tetrachloride, tantalum tetrachloride, or a combination thereof.

With reference to FIG. 24, a conductive material, for example, doped polysilicon, metal, metal nitride, or metal silicide, may be deposited into the high-level bit line trench 311 and the high-level bit line contact opening 313 by a metallization process. After the metallization process, a planarization process, such as chemical mechanical polishing, may be performed to remove excess filling material, provide a substantially flat surface for subsequent processing steps, and conformally form the high-level bit line 301 and the high-level bit line contact 305. In addition, a third liner 519 may be formed on and attached to sidewalls of the high-level bit line trench 311, a portion of a bottom of the high-level bit line trench 311, the sidewalls of the high-level bit line contact opening 313, and the bottom of the high-level bit line contact opening 313 before forming the high-level bit line 301 and the high-level bit line contact 305.

Referring to FIG. 24, in some embodiments, the width of the high-level bit line 301 is greater than the width of the high-level bit line contact 305 and the high-level bit line contact 303. In some embodiments, the high-level bit line 301 is asymmetrically positioned on the high-level bit line contact 305 and the high-level bit line contact 303.

Figure 25:
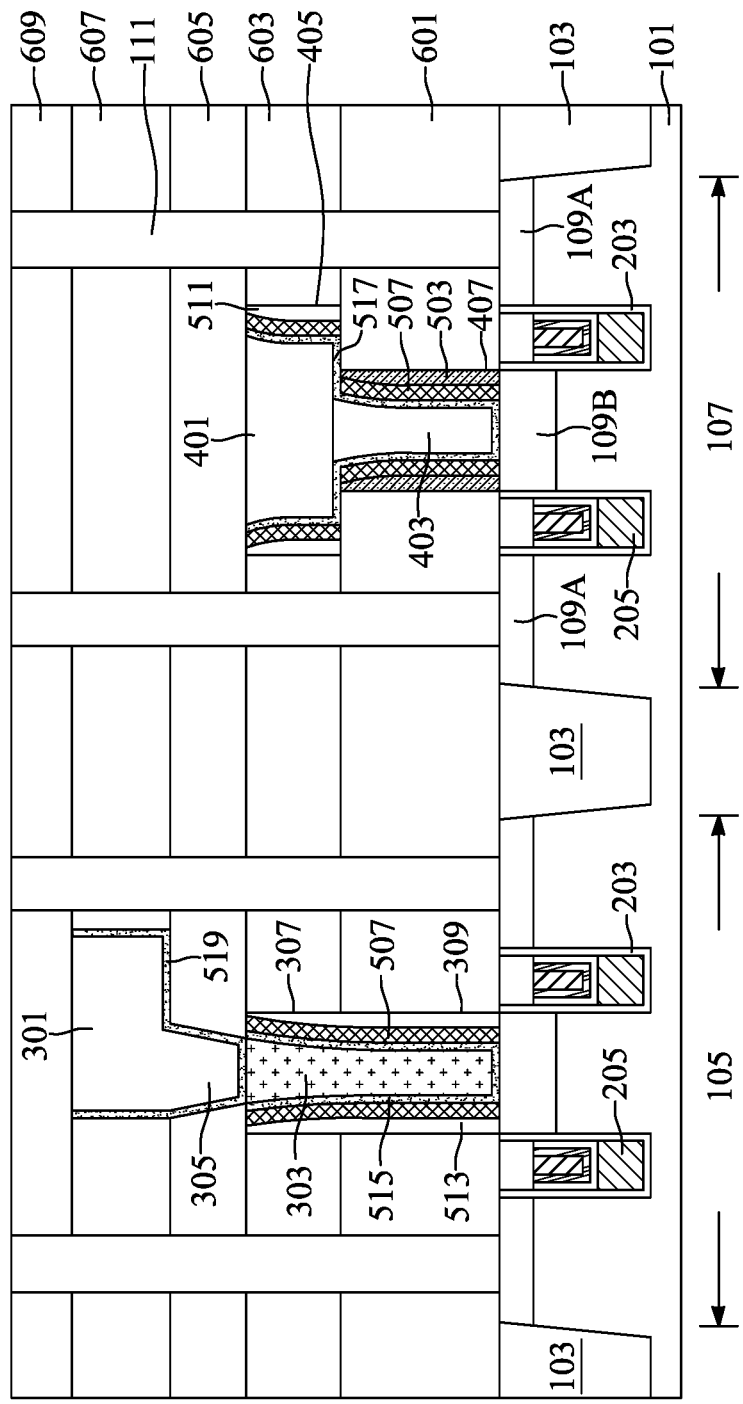
FIG. 25 is cross-sectional view illustrating an intermediate stage of forming a plurality of conductive plugs above the substrate at the step S29 in the method shown in FIG. 1, in accordance with some embodiments.

FIG. 25 is cross-sectional view illustrating an intermediate stage of forming a plurality of conductive plugs above the substrate at the step S29 in the method 10 shown in FIG. 1, in accordance with some embodiments. In some embodiments, a fifth insulating film 609 may be formed on the fourth insulating film 607. A photolithography process may be performed to define positions of the conductive plugs 111 in the fifth insulating film 609. After the photolithography process, an etch process, such as an anisotropic dry etch process, may be performed to form a plurality of conductive plug openings penetrating the fifth insulating film 609, the fourth insulating film 607, the third insulating film 605, the second insulating film 603, and the first insulating film 601. Top surfaces of the plurality of doped regions 109A disposed between the isolation layer 103 and the plurality of word lines 201 in both the first active region 105 and the second active region 107 may be exposed through the plurality of conductive plug openings.

With reference to FIG. 25, a conductive material, for example, doped polysilicon, titanium, titanium nitride, tantalum, tantalum nitride, tungsten, copper, aluminum or aluminum alloy, may be deposited into the plurality of conductive plug openings by a metallization process. After the metallization process, a planarization process, such as chemical mechanical polishing, may be performed to remove excess filling material, provide a substantially flat surface for subsequent processing steps, and conformally form the plurality of conductive plugs 111. The plurality of conductive plugs 111 may be respectively correspondingly electrically connected to the plurality of doped regions 109A disposed between the isolation layer 103 and the plurality of word lines 201 in both the first active region 105 and the second active region 107.

Figure 26:
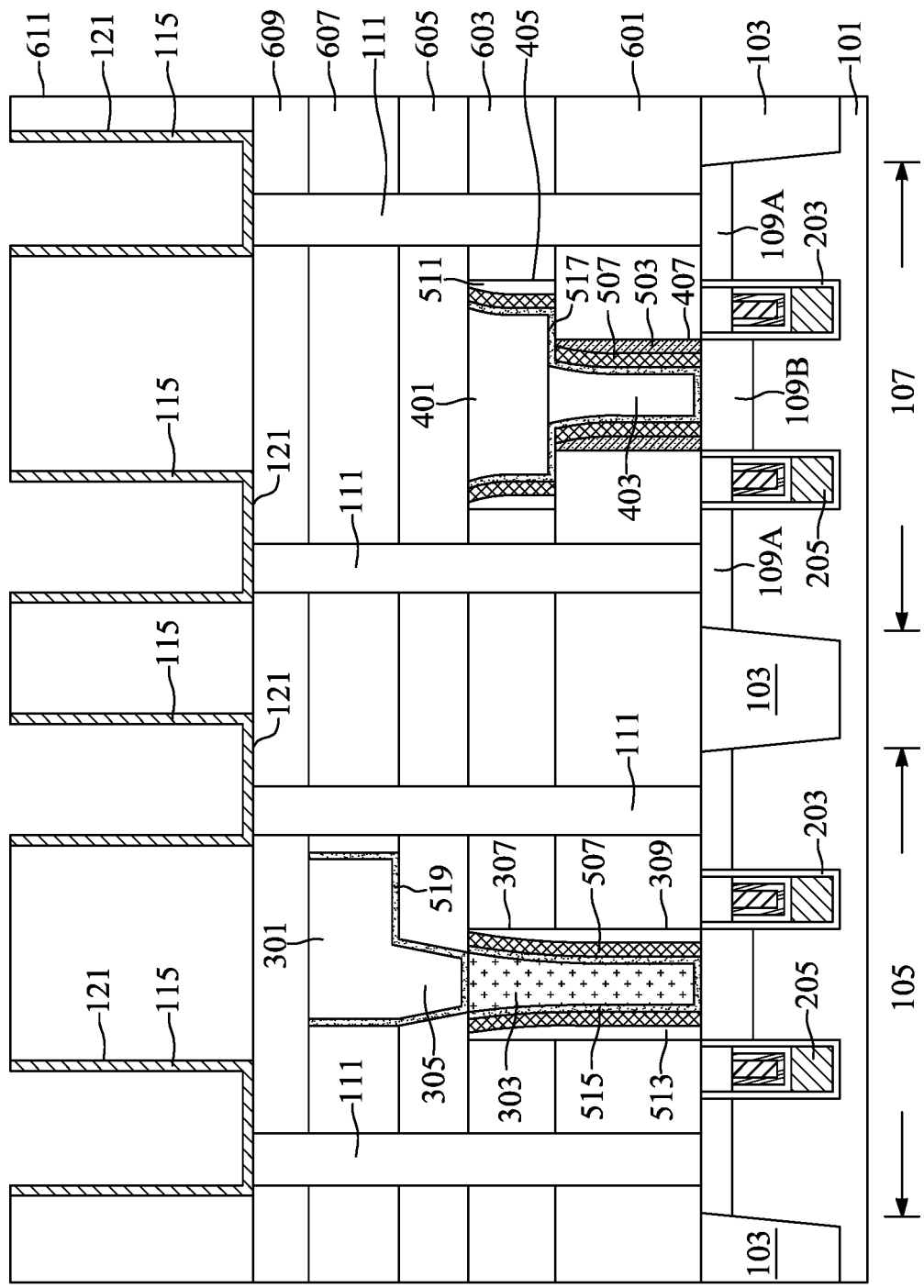
FIGS. 26-28 are cross-sectional views illustrating an intermediate stage of forming a plurality of capacitor structures above the substrate at the step S31 in the method shown in FIG. 1, in accordance with some embodiments.
Figure 27:
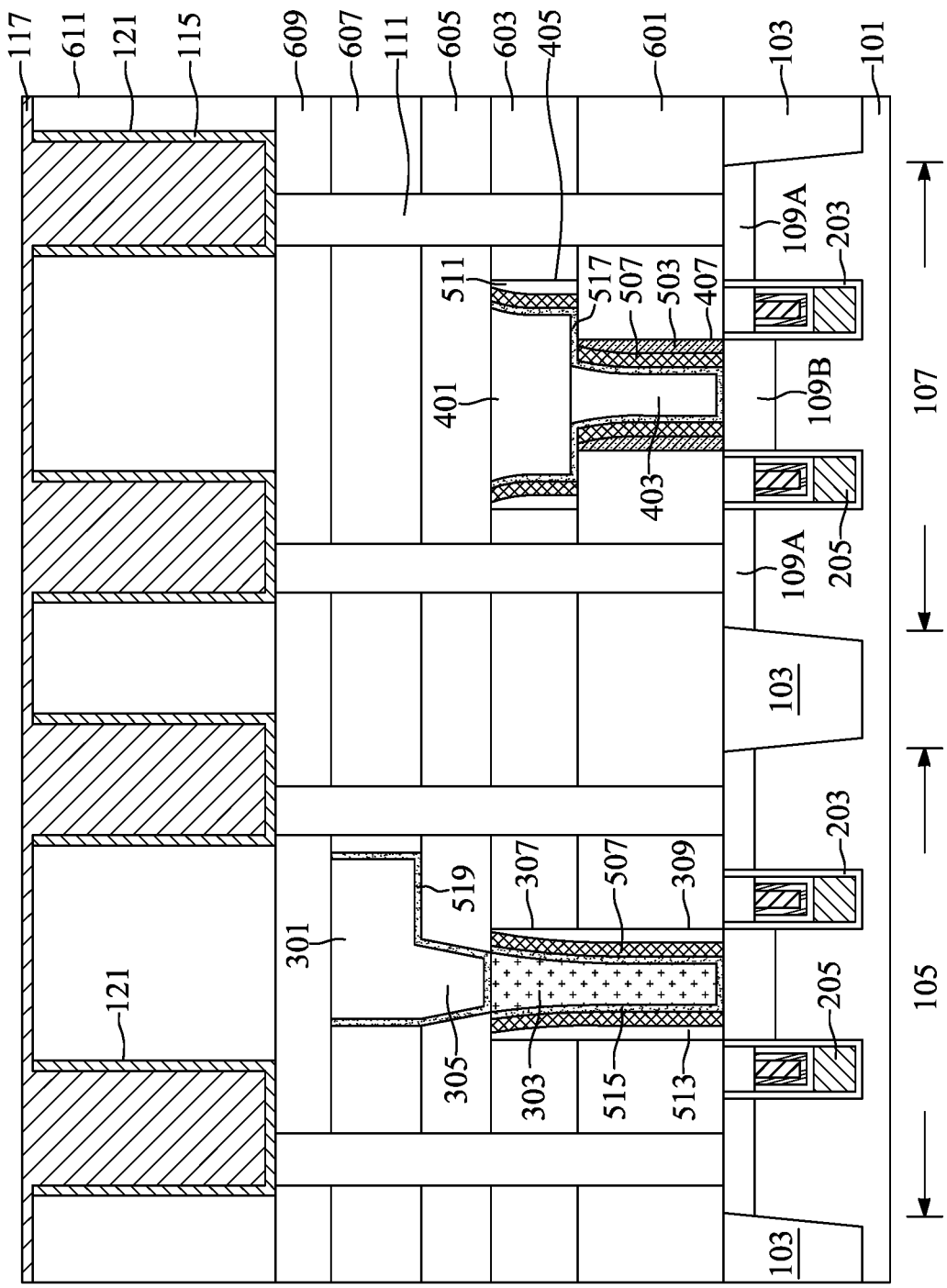
Figure 28:
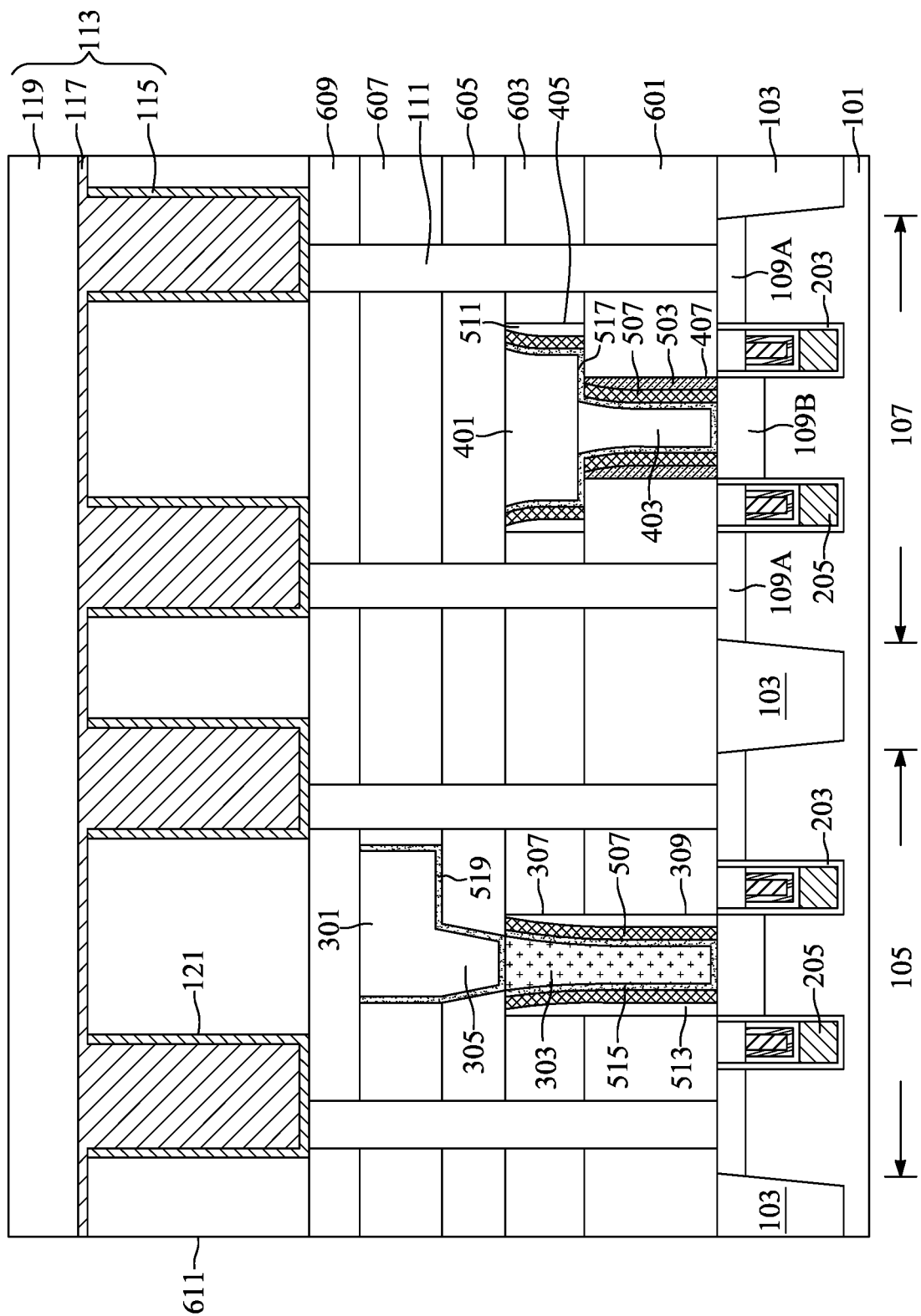

FIGS. 26-28 are cross-sectional views illustrating an intermediate stage of forming a plurality of capacitor structures above the substrate at the step S31 in the method 10 shown in FIG. 1, in accordance with some embodiments. In some embodiments, a plurality of capacitor structures 113 may be formed above the substrate 101. With reference to FIG. 26, a sixth insulating film 611 may be formed on the fifth insulating film 609. A photolithography process may be performed to define positions of the plurality of capacitor structures 113 in the sixth insulating film 611. After the photolithography process, an etch process, such as an anisotropic dry etch process, may be performed to form a plurality of capacitor trenches 121 in the sixth insulating film 611. Top surfaces of the plurality of conductive plugs 111 may be exposed through the plurality of capacitor trenches 121. A plurality of capacitor bottom electrodes 115 may be respectively correspondingly formed in the plurality of capacitor trenches 121.

With reference to FIG. 27, a capacitor insulating layer 117 may be formed on the plurality of capacitor bottom electrodes 115 and may fill the plurality of capacitor trenches 121.

With reference back to FIG. 28, a capacitor top electrode 119 may be formed on the capacitor insulating layer 117 and may fill the plurality of capacitor trenches 121. The plurality of capacitor bottom electrodes 115, the capacitor insulating layer 117, and the capacitor top electrode 119 together form the plurality of capacitor structures 113.

One aspect of the present disclosure provides a semiconductor memory device, comprising: an isolation layer defining a first active region in a substrate; a first doped region positioned in the first active region; a first word line buried in a first trench adjacent to the first doped region; a high-level bit line contact positioned on the first doped region; a first air gap surrounding the high-level bit line contact; wherein the first word line comprises a lower electrode structure and an upper electrode structure on the lower electrode structure; wherein the upper electrode structure comprises: a source layer substantially covering a sidewall of the first trench; a conductive layer on the source layer; and a work-function adjustment layer disposed between the source layer and the conductive layer.

Another aspect of the present disclosure provides a method for preparing a semiconductor memory device, comprising: forming an isolation layer defining a first active region in a substrate; forming a first doped region in the first active region; forming a first word line buried in a first trench adjacent to the first doped region; forming a high-level bit line contact positioned on the first doped region;

forming a first air gap surrounding the high-level bit line contact; wherein the forming of the first word line comprises: forming a lower electrode structure and an upper electrode structure on the lower electrode structure; wherein the forming of the upper electrode structure comprises: forming a source layer substantially covering a sidewall of the first trench; forming a conductive layer on the source layer; and forming a work-function adjustment layer disposed between the source layer and the conductive layer.

In conclusion, the work-function adjustment layer having a relatively low work function disposed outside the conductive layer of the upper electrode structure can reduce or minimize a gate-induced drain leakage current (GIDL) generated from the word line to the doped regions. In addition, the work function of the upper electrode structure may be adjusted by adjusting a doping concentration of the work-function adjustment layer. Thus, a desired low work function of the upper electrode structure may be achieved.

Furthermore, the semiconductor memory device includes a plurality of air gaps, and the conductive features are separated from the each other by the air gaps. Therefore, the parasitic capacitance between the conductive contacts may be reduced. As a result, the overall device performance may be improved (i.e., the decreased power consumption and resistive-capacitive (RC) delay), and the yield rate of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor memory device, comprising:
   an isolation layer defining a first active region in a substrate;
   a first doped region positioned in the first active region;
   a first word line buried in a first trench adjacent to the first doped region;
   a high-level bit line contact positioned on the first doped region;
   a first air gap surrounding the high-level bit line contact;
   a second word line buried in a second trench in a second active region of the substrate, the second active region being separated from the first active region by the isolation layer;
   a second doped region positioned adjacent to the second word line;
   a low-level bit line positioned over the second doped region;
   a second air gap positioned adjacent to the low-level bit line;
   a high-level bit line positioned on the high-level bit line contact; and
   a low-level bit line contact positioned between the low-level bit line and the second doped region;
   wherein the first word line comprises a lower electrode structure and an upper electrode structure on the lower electrode structure;
   wherein the upper electrode structure comprises: a source layer substantially covering a sidewall of the first trench; a conductive layer on the source layer; and a work-function adjustment layer disposed between the source layer and the conductive layer;
   wherein a height of the low-level bit line contact is less than a height of the high-level bit line contact.

2. The semiconductor memory device of claim 1, wherein a width of the low-level bit line is greater than a width of the low-level bit line contact.

3. The semiconductor memory device of claim 1, wherein a width of the high-level bit line is greater than a width of the high-level bit line contact.

4. The semiconductor memory device of claim 1, wherein a height of the high-level bit line contact is substantially the same as a combined height of the low-level bit line contact and the low-level bit line.

5. The semiconductor memory device of claim 1, wherein a top surface of the high-level bit line contact and a top surface of the low-level bit line are substantially at the same level.

6. The semiconductor memory device of claim 1, wherein the high-level bit line is asymmetrically positioned on the high-level bit line contact.

7. The semiconductor memory device of claim 1, wherein a work function of the lower electrode structure is higher than a work function of the upper electrode structure.

8. The semiconductor memory device of claim 1, wherein the work-function adjustment layer conformally covers an inner sidewall of the source layer.

9. The semiconductor memory device of claim 1, wherein the source layer extends between the lower electrode structure and the conductive layer to cover a top surface of the lower electrode structure.

10. The semiconductor memory device of claim 1, wherein the work-function adjustment layer includes a metal or a metal nitride, and wherein the work-function adjustment element includes lanthanum (La).

11. A method for preparing a semiconductor memory device, comprising:
    forming an isolation layer defining a first active region in a substrate;
    forming a first doped region in the first active region;
    forming a first word line buried in a first trench adjacent to the first doped region;
    forming a high-level bit line contact positioned on the first doped region;
    forming a first air gap surrounding the high-level bit line contact;
    wherein the forming of the first word line comprises: forming a lower electrode structure and an upper electrode structure on the lower electrode structure;
    wherein the forming of the upper electrode structure comprises: forming a source layer substantially covering a sidewall of the first trench; forming a conductive layer on the source layer;
    and forming a work-function adjustment layer disposed between the source layer and the conductive layer.

12. The method for preparing a semiconductor memory device of claim 11, further comprising:
- forming a second doped region in a second active region of the substrate, the second active region being separated from the first active region by the isolation layer;
- forming a second word line buried in a second trench adjacent to second doped region;
- forming a low-level bit line over the second doped region; and
- forming a second air gap adjacent to the low-level bit line.

13. The method for preparing a semiconductor memory device of claim 12, further comprising:
- forming a high-level bit line on the high-level bit line contact; and
- forming a low-level bit line contact between the low-level bit line and the second doped region;
- wherein a height of the low-level bit line contact is less than a height of the high-level bit line contact.

14. The method for preparing a semiconductor memory device of claim 13, wherein the first air gap and the second air gap are integrally formed, and the low-level bit line contact, the low-level bit line, and the high-level bit line contact are integrally formed.

15. The method for preparing a semiconductor memory device of claim 13, wherein a top surface of the high-level bit line contact and a top surface of the low-level bit line are substantially at the same level.

16. The method for preparing a semiconductor memory device of claim 11, wherein a work function of the lower electrode structure is higher than a work function of the upper electrode structure.

17. The method for preparing a semiconductor memory device of claim 11, wherein the work-function adjustment layer conformally covers an inner sidewall of the source layer.

18. The method for preparing a semiconductor memory device of claim 11, wherein the work-function adjustment layer includes a metal or a metal nitride, and wherein the work-function adjustment element includes lanthanum (La).

* * * * *